United States Patent
Adachi

(10) Patent No.: US 9,913,379 B2
(45) Date of Patent: Mar. 6, 2018

(54) COMPONENT-EMBEDDED SUBSTRATE

(71) Applicant: Murata Manufacturing Co., Ltd., Kyoto-fu (JP)

(72) Inventor: Toshiro Adachi, Kyoto-fu (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 423 days.

(21) Appl. No.: 14/326,605

(22) Filed: Jul. 9, 2014

(65) Prior Publication Data
US 2014/0321085 A1 Oct. 30, 2014

Related U.S. Application Data

(63) Continuation of application No. PCT/JP2013/052884, filed on Feb. 7, 2013.

(30) Foreign Application Priority Data

Feb. 17, 2012 (JP) ................................ 2012-033069

(51) Int. Cl.
*H05K 1/18* (2006.01)
*H05K 1/03* (2006.01)
(Continued)

(52) U.S. Cl.
CPC ........... *H05K 1/185* (2013.01); *H05K 1/0313* (2013.01); *H05K 3/4697* (2013.01);
(Continued)

(58) Field of Classification Search
CPC ........ H05K 1/111; H05K 1/186; H05K 1/188; H05K 2201/10522; H05K 3/4069; H05K 3/4617; H05K 3/4697
See application file for complete search history.

(56) References Cited

U.S. PATENT DOCUMENTS 6,038,133 A * 3/2000 Nakatani ............. G06F 17/3089
174/255
2004/0160751 A1 8/2004 Inagaki
(Continued)

FOREIGN PATENT DOCUMENTS

JP 2002-118367 A 4/2002
JP 2005-197354 A 7/2005
(Continued)

OTHER PUBLICATIONS

International Search Report issued in Application No. PCT/JP2013/052884 dated Mar. 12, 2013.
(Continued)

*Primary Examiner* — Binh Tran
(74) *Attorney, Agent, or Firm* — Pearne & Gordon LLP

(57) ABSTRACT

A component-embedded substrate includes: a resin substrate having a mount surface and a peripheral surface surrounding a perimeter of the mount surface; a first mounted component mounted on the mount surface; a second mounted component mounted on the mount surface and spaced from the first mounted component; a first chip-type electronic component disposed in the resin substrate; and a second chip-type electronic component disposed in the resin substrate and spaced from the first chip-type electronic component. The first and second chip-type electronic components are spaced from each other along a cross direction crossing an arrangement direction along which the first mounted component and the second mounted component that are arranged with respect to each other. The first and second chip-type electronic components are each arranged to cross the cross direction.

14 Claims, 21 Drawing Sheets

(51) Int. Cl.
   *H05K 7/00* (2006.01)
   *H05K 1/11* (2006.01)
   *H05K 3/40* (2006.01)
   *H05K 3/46* (2006.01)
(52) U.S. Cl.
   CPC ............... *H01L 2224/16225* (2013.01); *H01L 2924/15311* (2013.01); *H05K 1/111* (2013.01); *H05K 1/186* (2013.01); *H05K 3/4069* (2013.01); *H05K 3/4617* (2013.01); *H05K 2201/10522* (2013.01)

(56) References Cited

U.S. PATENT DOCUMENTS

2008/0094793 A1*  4/2008  Sakurai .................... G11C 5/04
                                                        361/679.01
2009/0107703 A1   4/2009  Abe
2011/0248389 A1*  10/2011 Yorita .................. H01L 23/3677
                                                        257/659
2012/0281379 A1*  11/2012 Shimada ............... H01L 21/486
                                                        361/782

FOREIGN PATENT DOCUMENTS

JP    2005-197389 A    7/2005
JP    2005-223226 A    8/2005
JP    2008-311243 A    12/2008
WO    2007/119608 A1   10/2007

OTHER PUBLICATIONS

Written Opinion issued in Application No. PCT/JP2013/052884 dated Mar. 12, 2013.

* cited by examiner

COMPONENT-EMBEDDED SUBSTRATE

TECHNICAL FIELD

The present invention relates to a component-embedded substrate, and particularly relates to a component-embedded substrate in which electronic components are mounted.

BACKGROUND ART

Recently, a variety of electronic devices such as mobile communication terminal and notebook PC have increasingly been enhanced in performance and reduced in size, and accordingly the electronic device is mounted with a semiconductor module or the like.

For example, a semiconductor module disclosed in Japanese Patent Laying-Open No. 2005-197389 includes: a substrate having an insulating layer and a conductor layer; a reinforcement portion provided in a peripheral portion of the substrate; and an electronic component provided in a component-mounted region of the substrate.

In this semiconductor module, the peripheral portion of the substrate is reinforced by the reinforcement portion provided in the peripheral portion, and occurrence of cracks to end faces of the substrate is thus suppressed.

A semiconductor module disclosed in Japanese Patent Laying-Open No. 2005-197354 includes a multilayer substrate, a cavity formed in a component-mount surface of the multilayer substrate, and an electronic component provided in this cavity. The cavity extends to a side surface of the multilayer substrate, and an end of the cavity is opened to the side surface of the multilayer substrate.

CITATION LIST

Patent Document

PTD 1: Japanese Patent Laying-Open No. 2005-197389
PTD 2: Japanese Patent Laying-Open No. 2005-197354

SUMMARY OF INVENTION

Technical Problem

The semiconductor module disclosed in Japanese Patent Laying-Open No. 2005-197389, however, has problems such as the need to provide the reinforcement portion and the reduction of the area where the electronic component is mounted.

The semiconductor module disclosed in Japanese Patent Laying-Open No. 2005-197354 also has a problem that formation of the cavity undesirably makes it more likely that cracks will occur.

The present invention has been made in view of the above problems, and an object of the invention is to provide a component-embedded substrate that enables occurrence of cracks to be suppressed.

Solution to Problem

A component-embedded substrate according to the present invention includes: a resin substrate having a mount surface and a peripheral surface surrounding a perimeter of the mount surface; a first mounted component mounted on the mount surface; a second mounted component mounted on the mount surface and spaced from the first mounted component; a first chip-type electronic component disposed in the resin substrate; and a second chip-type electronic component disposed in the resin substrate and spaced from the first chip-type electronic component. The mount surface includes, as seen from above the mount surface: a first region located between the first mounted component and the second mounted component and extending along a cross direction crossing an arrangement direction along which the first mounted component and the second mounted component are arranged with respect to each other; a second region located opposite to the second mounted component with respect to the first region; and a third region located opposite to the first mounted component with respect to the first region. The first chip-type electronic component and the second chip-type electronic component are spaced from each other along the cross direction. The first chip-type electronic component and the second chip-type electronic component are arranged to extend from the second region across the first region to the third region as seen from above the mount surface.

Preferably, at least one of the first chip-type electronic component and the second chip-type electronic component is arranged to extend from below the first mounted component across the first region to below the second mounted component, as seen from above the mount surface.

Preferably, the component-embedded substrate further includes: a third mounted component mounted on the mount surface and spaced from the first mounted component and the second mounted component; and a third chip-type electronic component disposed in the resin substrate. The third chip-type electronic component is arranged to extend from below the first mounted component to below the third mounted component, or from below the second mounted component to below the third mounted component, as seen from above the mount surface.

Preferably, the first chip-type electronic component is located relatively closer to the peripheral surface of the resin substrate as compared with the third chip-type electronic component. The first chip-type electronic component is larger in size than the third chip-type electronic component.

Preferably, the resin substrate has a lower surface located opposite to the mount surface. The first chip-type electronic component is located relatively closer to the mount surface than to the lower surface.

Preferably, the component-embedded substrate further includes a fourth chip-type electronic component disposed in the resin substrate. The resin substrate has a lower surface located opposite to the mount surface. The fourth chip-type electronic component is located relatively closer to the lower surface as compared with the first chip-type electronic component. The first chip-type electronic component is larger in size than the fourth chip-type electronic component.

Advantageous Effects of Invention

The component-embedded substrate of the present invention enables occurrence of cracks to be suppressed.

DESCRIPTION OF EMBODIMENTS

A description will be given of a resin substrate and an electronic device having this resin substrate according to the present invention.

First Embodiment

Figure 1:
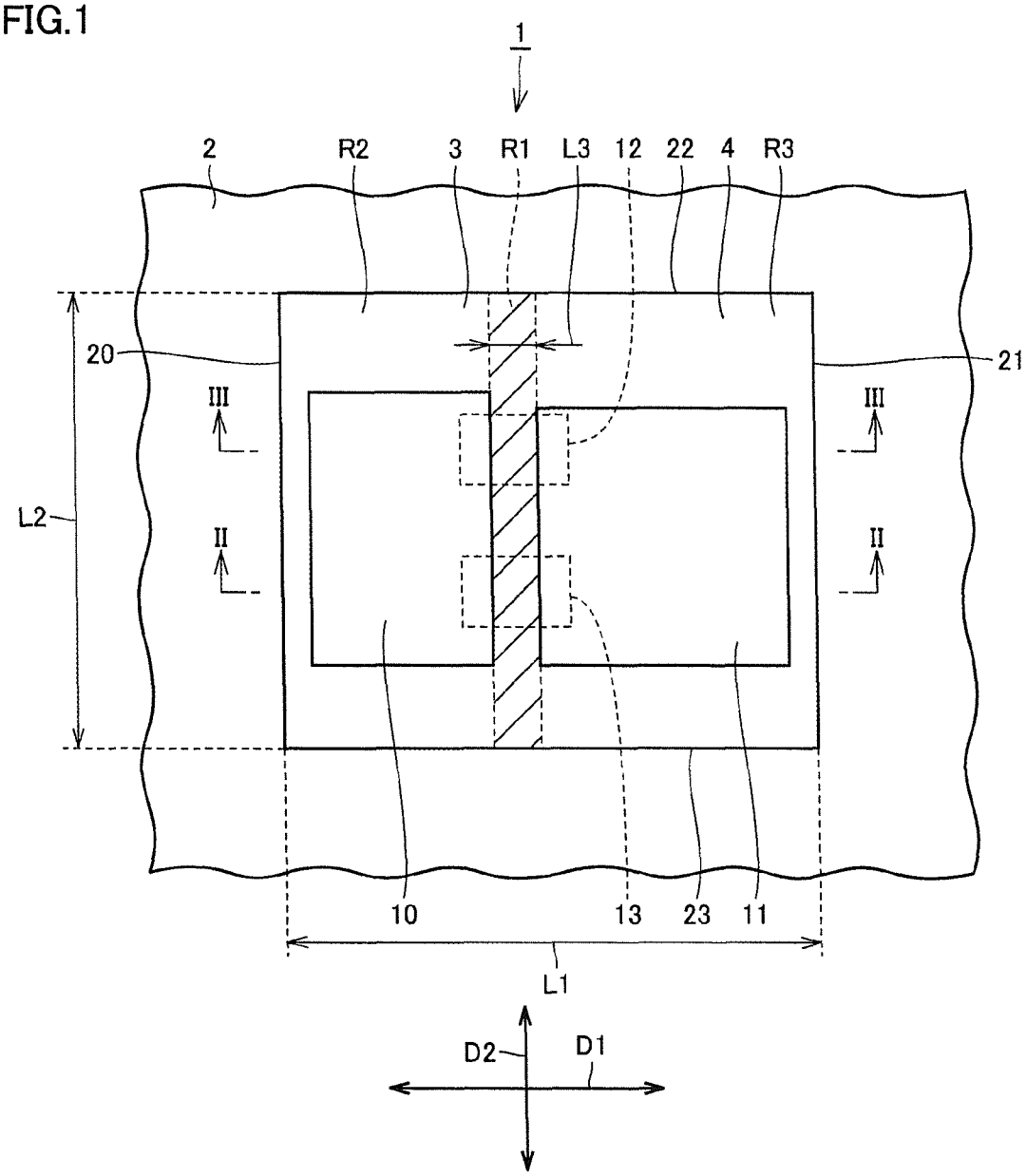
FIG. 1 is a plan view showing a part of an electronic device 1 according to a first embodiment.
Figure 2:
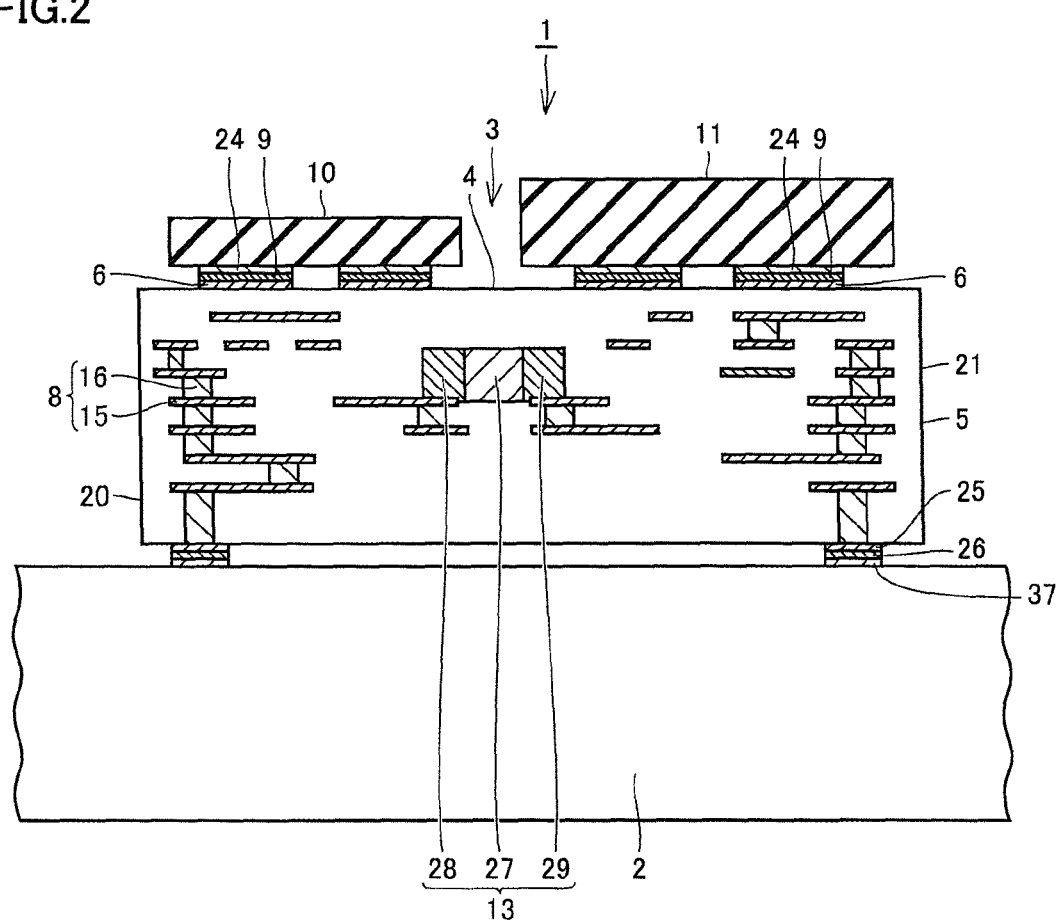
FIG. 2 is a cross-sectional view along a line II-II shown in FIG. 1.
Figure 3:
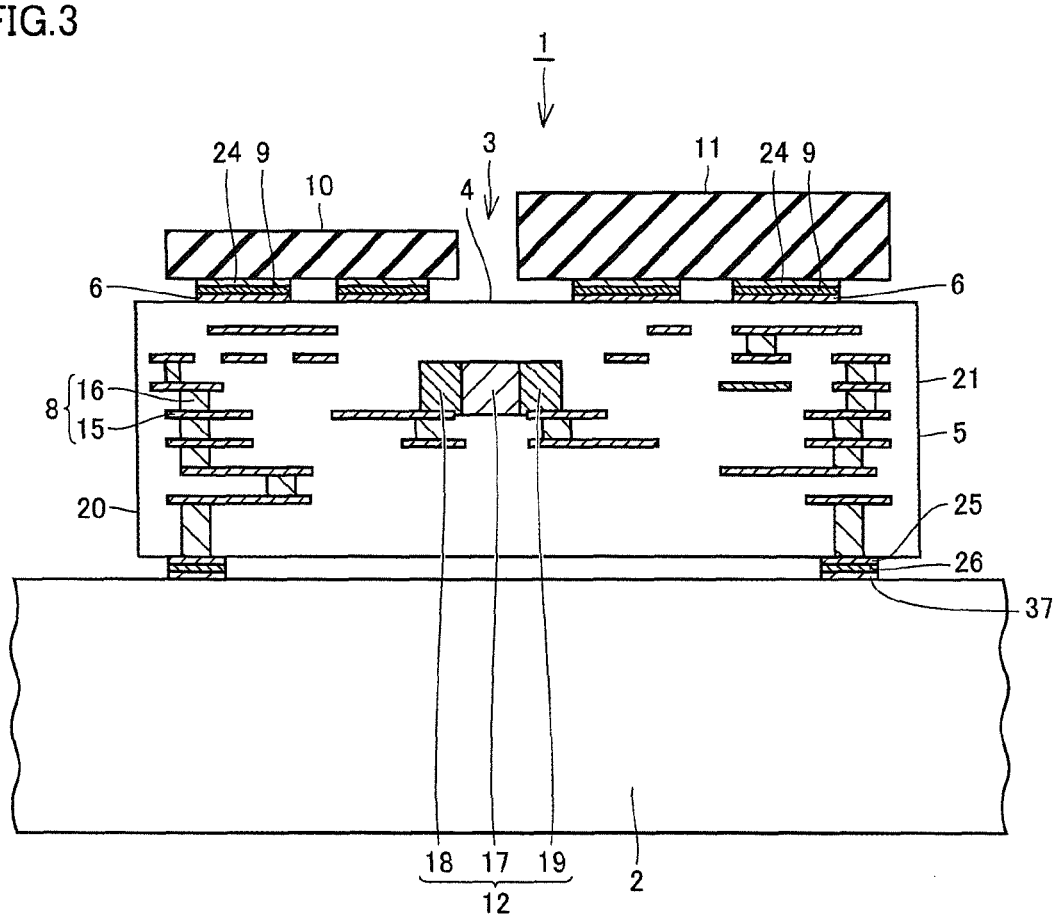
FIG. 3 is a cross-sectional view along a line III-III shown in FIG. 1.

FIG. 1 is a plan view showing a part of an electronic device 1 according to a first embodiment, and FIG. 2 is a cross-sectional view along a line II-II shown in FIG. 1. FIG. 3 is a cross-sectional view along a line III-III shown in FIG. 1.

As shown in FIGS. 1 to 3, electronic device 1 includes a circuit board 2 and a component-embedded substrate 3 implemented on a main surface of circuit board 2. On the main surface of circuit board 2, a circuit interconnect 37 is formed, and component-embedded substrate 3 is connected to circuit interconnect 37 by a joint member 26 such as solder.

In FIG. 2, component-embedded substrate 3 includes a resin substrate 5 having a mount surface 4, a surface conductor 6 formed on mount surface 4, an internal conductor 8 formed in resin substrate 5, and a mounted component 10 and a mounted component 11 arranged on mount surface 4 and connected to surface conductor 6 by a joint member 9 such as solder.

Component-embedded substrate 3 includes chip-type electronic components 12, 13 provided in resin substrate 5. Resin substrate 5 is formed in a rectangular shape in the example shown in FIG. 1 for example, has a lateral length L1 of approximately 6.5 mm for example and a longitudinal length of approximately 5.0 mm for example.

The peripheral surface of resin substrate 5 includes a side surface 20 and a side surface 21 that are located with respect to each other along an arrangement direction D1, and a side surface 22 and a side surface 23 that are located with respect to each other along an arrangement direction D2.

Resin substrate 5 is formed by laminating a plurality of resin layers and thereafter heating the resin layers to which pressure is being applied. As a material for the resin layers, a thermosetting resin such as epoxy resin, a thermoplastic resin such as polyimide or liquid crystal polymer, or the like is used. Thermoplastic resins such as polyimide and liquid crystal polymer are preferable since layers of a thermoplastic resin are easy to be formed into a multilayer by lamination or compression bonding. In particular, the liquid crystal polymer is suitable as the material for resin layers of a chip component-embedded resin substrate to be used for a high-frequency circuit module, since the liquid crystal polymer has a high Q factor and low water absorbency. While the thickness of each resin layer is not particularly limited, the thickness thereof is preferably 10 to 100 μm.

In FIG. 2, surface conductor 6 is typically formed of a metal material. For example, as this metal material, a metal foil made of copper, silver, aluminum, SUS, nickel, or gold, or an alloy of any of them may be used. Preferably, a copper (Cu) foil is used since the copper foil has a low specific resistance and a small loss for a high-frequency band. While the thickness of surface conductor 6 is not particularly limited, the thickness thereof is preferably 5 to 50 μm.

Surface conductor 6 is formed on mount surface 4 of resin substrate 5, and an electrode 25 is formed on the back surface (the surface opposite to the mount surface) of resin substrate 5. Electrode 25 is also formed of a metal material similar to that for surface conductor 6. Electrode 25 is connected to circuit interconnect 37 by a joint member 26 such as solder.

Internal conductor 8 is made up of a plurality of internal interconnects 15 and a plurality of vias 16. As a material for internal interconnect 15, a metal material similar to a metal foil made of a metal material which forms surface conductor 6, for example, may be used. Via 16 is also formed by a cured conductive paste made of a conductive metal material.

Mounted components (first and second mounted components of the present invention) 10, 11 include electrodes 24 disposed on the lower surfaces of mounted components 10, 11, and electrodes 24 of mounted components 10, 11 are each connected to surface conductor 6 by a joint member 9 such as solder. Mounted components 10, 11 are for example semiconductor chips. As shown in FIG. 1, mounted component 10 and mounted component 11 are spaced from each other. A length L3 between mounted component 10 and mounted component 11 is approximately 0.5 mm for example.

In mount surface 4, a region R1, a region R2, and a region R3 are defined. Region R1 is a region extending between mounted component 10 and mounted component 11 along direction D2 which crosses arrangement direction D1 along which mounted component 10 and mounted component 11 are arranged with respect to each other. Region R1 extends from side surface 20 to side surface 21. Region R1 is located between a portion of mounted component 10 that is closest to mounted component 11 and a portion of mounted component 11 that is closest to mounted component 10. In the example shown in FIG. 1, mounted component 10 and mounted component 11 are each formed in the shape of a substantially rectangular parallelepiped. Thus, region R1 is located between a side portion of the peripheral portion of mounted component 10 that is closest to mounted component 11, and a side portion of mounted component 11 that is closest to mounted component 10.

Region R2 is a region located opposite to mounted component 11 with respect to region R1. Region R3 is a region located opposite to mounted component 10 with respect to region R1. Namely, region R2 is a region where mounted component 10 is disposed, and region R3 is a region where mounted component 11 is disposed.

Chip-type electronic components 12, 13 are embedded in resin substrate 5. These chip-type electronic components 12, 13 are each a rectangular component body having side surfaces provided with side terminal electrodes.

Examples of chip-type electronic components 12, 13 include passive components such as chip-type capacitor, chip-type resistor, and chip-type inductor, and active components such as IC, for example.

In connection with the present embodiment, an example will be described where chip-type capacitors are employed as chip-type electronic components 12, 13. In the first embodiment, chip-type electronic components 12, 13 each have a lateral dimension of 0.6 mm, a longitudinal dimension of 0.3 mm, and a height dimension of 0.15 mm. These dimensions are given herein by way of example. Components designed to have other dimensions may also be employed.

In FIG. 2, chip-type electronic component 13 includes a dielectric body 27 having an internal electrode, an electrode 28 disposed on one side surface of dielectric body 27, and an electrode 29 disposed on the other side surface of dielectric body 27. Electrodes 28, 29 are each formed of a laminated metal film of Ni (nickel) and Sn (tin), or the like.

In FIG. 3, chip-type electronic component 12 includes a dielectric body 17, an electrode 18 disposed on one side surface of dielectric body 17, and an electrode 19 disposed on the other side surface of dielectric body 17. Electrodes 18, 19 are each formed of a laminated metal film of Ni (nickel) and Sn (tin), or the like.

In FIG. 1, in the plan view of component-embedded substrate 3 as seen from above mount surface 4, chip-type electronic components 12, 13 are arranged to extend from region R2 across region R1 to region R3. Chip-type electronic components 12, 13 are arranged to also extend from below mounted component 10 across region R1 to below mounted component 11.

Chip-type electronic component 12 is located relatively closer to side surface 22 as compared with chip-type electronic component 13, and chip-type electronic component 13 is located relatively closer to side surface 23 as compared with chip-type electronic component 12.

As shown in FIGS. 2 and 3, chip-type electronic components 12, 13 are located relatively closer to mount surface 4 than to the lower surface of resin substrate 5.

An elastic modulus of each of mounted component 10, mounted component 11, and resin substrate 5 is higher than an elastic modulus of chip-type electronic components 12, 13. The size of resin substrate 5 is larger than the size of mounted components 10, 11 and chip-type electronic components 12, 13.

A description will be given of a case where an impact force is externally applied to electronic device 1 and component-embedded substrate 3 configured in the above-described manner.

The case where an impact force is applied to electronic device 1 and component-embedded substrate 3 may be the one where a user drops a mobile terminal or the like which is mounted with electronic device 1 and component-embedded substrate 3.

At this time, because the elastic modulus of resin substrate 5 is higher than the elastic modulus of mounted components 10, 11, the impact force applied to component-embedded substrate 3 causes a flexure stress due to a flexure impact to be applied to resin substrate 5, so that a part of resin substrate 5, specifically the part located between mounted component 10 and mounted component 11, is subjected to a large stress.

Regarding region R2, mounted component 10 is implemented in region R2 and therefore the flexure stress is less likely to occur to region R2 even when an impact force is applied thereto. Regarding region R3 as well, mounted component 11 is mounted in region R3 and therefore the flexure stress is less likely to occur to region R3 even when an impact force is applied thereto. As a result, flexure occurs chiefly to region R1.

Meanwhile, chip-type electronic components 12, 13 are arranged to extend from region R2 where flexure is less likely to occur to region R1 and further from region R1 to region R3 where flexure is less likely to occur.

Region R1 is thus reinforced by chip-type electronic components 12, 13. Even when an impact force is applied to component-embedded substrate 3, occurrence of cracks to resin substrate 5 is suppressed. Further, since chip-type electronic component 12 and chip-type electronic component 13 are spaced from each other along direction D2, a large extent of region R1 is reinforced.

It should be noted here that when an impact force is applied to component-embedded substrate 3, a greater flexure stress is exerted on the mount surface 4 side of resin substrate 5, since mounted component 10 and mounted component 11 are disposed on mount surface 4.

Regarding electronic device 1 and component-embedded substrate 3 of the first embodiment, chip-type electronic components 12, 13 are located relatively closer to mount surface 4 than to the lower surface of resin substrate 5, and thus the mount-surface 4 side of resin substrate 5 is reinforced by chip-type electronic components 12, 13. Therefore, even when an impact force is applied to resin substrate 5, occurrence of cracks to resin substrate 5 can be suppressed. Accordingly, occurrence of cracks to component-embedded substrate 3 can surely be suppressed without the need to provide a special reinforcement member or the like.

A description will be given, using FIGS. 4 to 17, of a method for manufacturing component-embedded substrate 3 and electronic device 1 configured in the above-described manner.

The method for manufacturing component-embedded substrate 3 generally includes: the step of forming a plurality of resin layers; the step of laminating the plurality of resin layers; the step of heating the plurality of resin layers to thereby form a first substrate in which cavities are formed that are to receive chip-type electronic components 12, 13; and the step of causing chip-type electronic components 12, 13 to be received in this first substrate. The method for manufacturing component-embedded substrate 3 further includes the step of laminating a plurality of resin layers on the first substrate in which chip-type electronic components 12, 13 are received, and the step of performing a heat treatment after the plurality of resin layers is formed on chip-type electronic components 12, 13.

FIGS. 4 to 12 are cross-sectional views showing respective steps for manufacturing respective resin layers.

Figure 4:
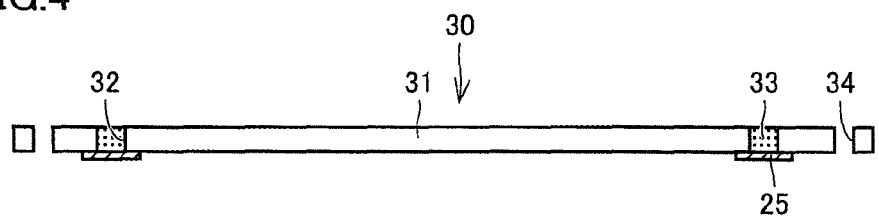
FIG. 4 is a cross-sectional view showing the step of forming a first resin layer 30.

FIG. 4 is a cross-sectional view showing the step of forming a first resin layer 30. When resin layer 30 is to be formed, initially a resin sheet 31 is prepared that has a surface where a metal film made up of a metal foil of copper (Cu) or the like is formed and has a corner where a hole 34 is formed. Thereafter, the metal film is patterned by etching or the like to form an electrode 25 on resin sheet 31. Next, in resin sheet 31, a via hole 32 is formed by means of a laser or the like. Next, via hole 32 is filled with a paste 33 containing metal powder and an organic solvent or the like. In this way, resin layer 30 shown in FIG. 4 is formed. In hole 34, a columnar part of a mold is to be inserted, as described later herein, and hole 34 is formed in a corner for example of resin layer 30.

Figure 5:
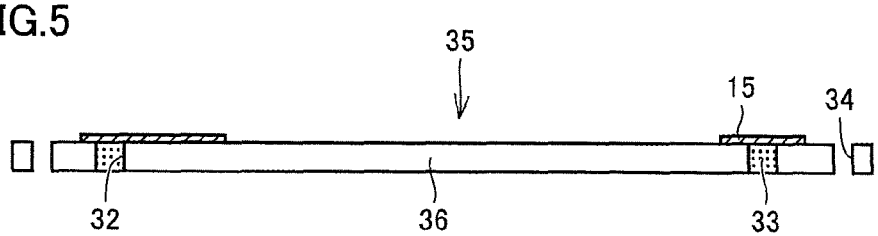
FIG. 5 is a cross-sectional view showing the step of forming a second resin layer 35.
Figure 6:
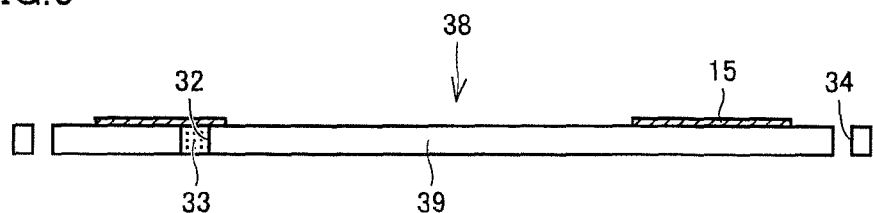
FIG. 6 is a cross-sectional view showing the step of forming a third resin layer 38.

FIG. 5 is a cross-sectional view showing the step of forming a second resin layer 35, and FIG. 6 is a cross-sectional view showing the step of forming a third resin layer 38.

When resin layers 35, 38 are to be formed, initially resin sheets 36, 39 are prepared that each have an upper surface where a metal film made up of a metal foil is formed, and the metal film is patterned by etching to form an internal interconnect 15. Next, in resin sheets 36, 39, via holes 32 are formed, and the via holes are filled with paste 33. In this way, resin layers 35, 38 are formed.

Figure 7:
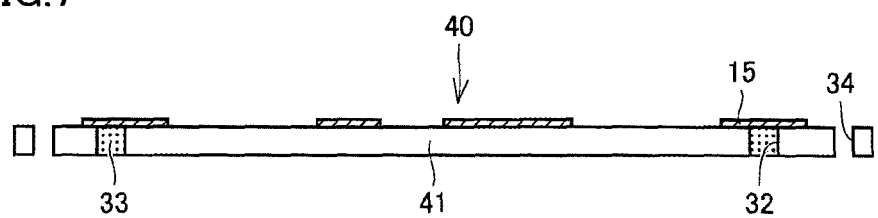
FIG. 7 is a cross-sectional view showing the step of forming a fourth resin layer 40.
Figure 8:
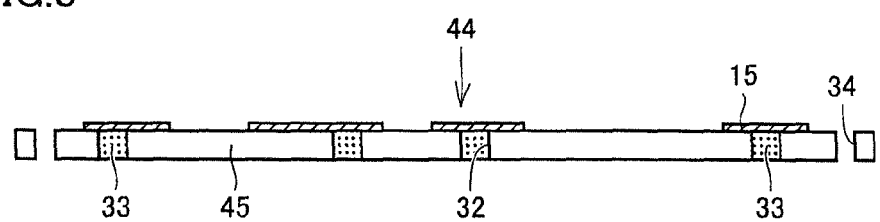
FIG. 8 is a cross-sectional view showing the step of forming a fifth resin layer 44.

FIG. 7 is a cross-sectional view showing the step of forming a fourth resin layer 40, and FIG. 8 is a cross-sectional view showing the step of forming a fifth resin layer 44. In FIGS. 7 and 8, when resin layers 40, 44 are to be formed, resin sheets 41, 45 are initially prepared so that each has an upper surface where a metal film made up of a metal foil is formed. Next, respective metal films are etched to form internal interconnects 15 on respective upper surfaces of resin sheets 41, 45.

Next, in resin sheets 41, 45, via holes 32 are formed by means of a laser. Then, via holes 32 are filled with paste 33. In this way, resin layer 40 and resin layer 44 are formed.

Figure 9:
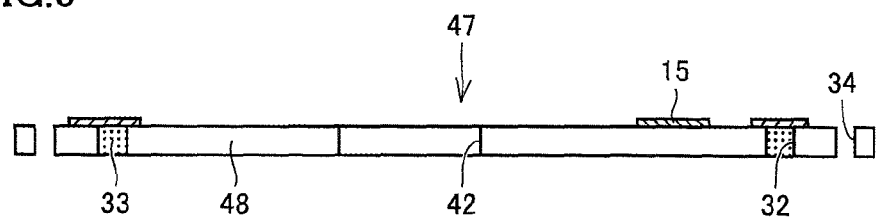
FIG. 9 is a cross-sectional view showing the step of forming a sixth resin layer 47.
Figure 10:
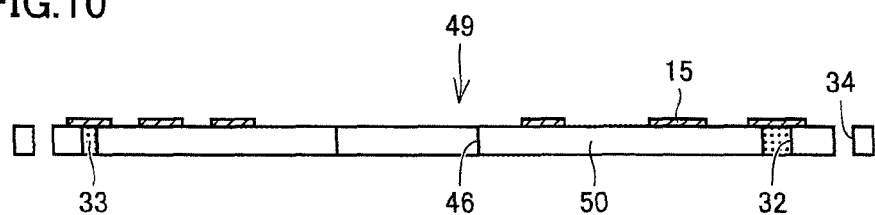
FIG. 10 is a cross-sectional view showing the step of forming a seventh resin layer 49.
Figure 11:
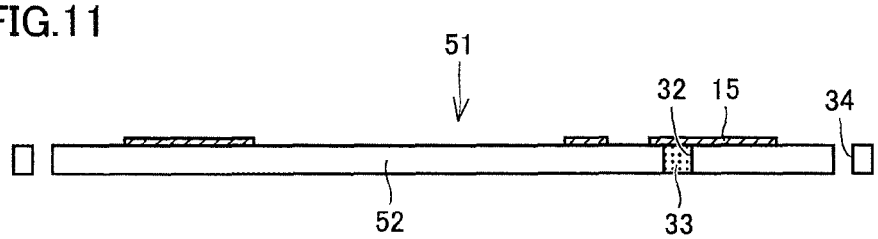
FIG. 11 is a cross-sectional view showing the step of forming an eighth resin layer 51.

FIG. 9 is a cross-sectional view showing the step of forming a sixth resin layer 47, and FIG. 10 is a cross-sectional view showing the step of forming a seventh resin layer 49. FIG. 11 is a cross-sectional view showing the step of forming an eighth resin layer 51.

In FIGS. 9 to 11, when resin layers 47, 49, 51 are to be formed, initially resin sheets 48, 50, 52 are prepared that each has an upper surface where a metal film made up of a metal foil is formed. Next, respective metal films are etched to form internal interconnects 15.

Next, in resin sheets 48, 50, 52, via holes 32 are formed by means of a laser. Then, via holes 32 are filled with paste 33. In this way, resin layer 51 is formed.

Next, in resin sheets 48 and 50, hole portions 42 and 46 are formed by punching resin sheets 41 and 45 by means of a mold, respectively. In this way, resin layer 47 and resin layer 49 are formed.

Figure 12:
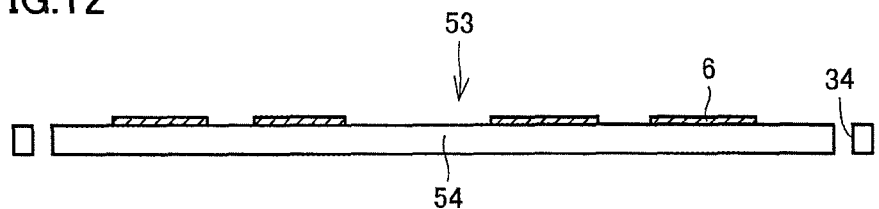
FIG. 12 is a cross-sectional view showing the step of forming a topmost resin layer 53.

FIG. 12 is a cross-sectional view showing the step of forming a topmost resin layer 53. In FIG. 12, when resin layer 53 is to be formed, initially a resin sheet 54 is prepared that has a top surface where a metal film made up of a metal foil is formed. Next, the metal film is patterned to form surface conductor 6. Next, a hole 34 is formed in resin sheet 54 by means of a laser. In this way, resin layer 53 is formed.

Figure 13:
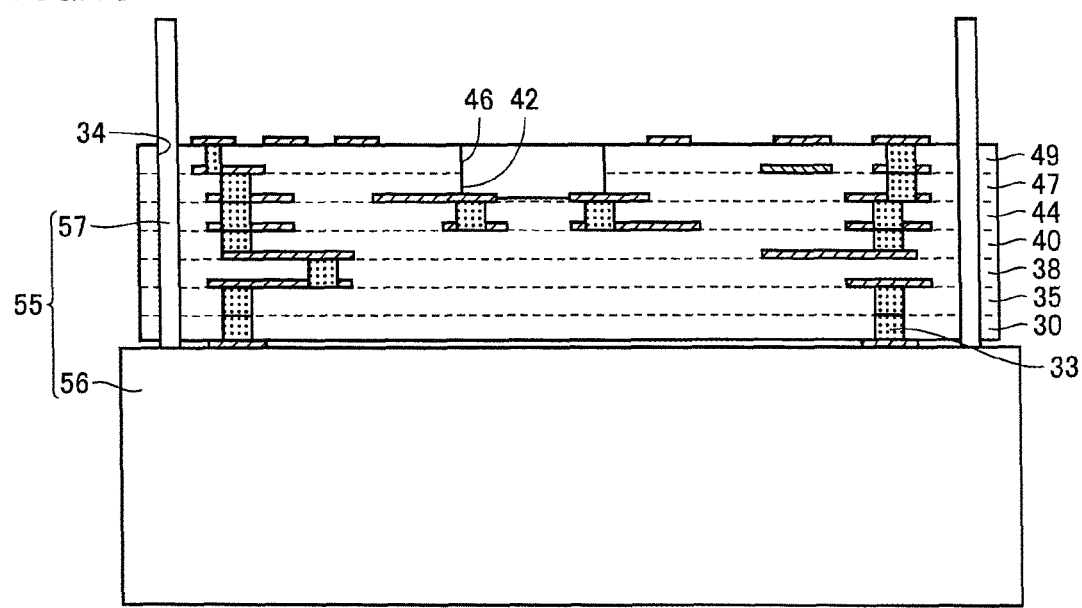
FIG. 13 is a cross-sectional view showing the step of laminating a plurality of resin layers.

FIG. 13 is a cross-sectional view showing the step of laminating a plurality of resin layers. As shown in FIG. 13, when the resin layers are to be laminated, a mold 55 is used to laminate the plurality of resin layers.

Mold 55 includes a platform 56 and a plurality of columnar parts 57 provided on the upper surface of platform 56. In the step shown in FIG. 13, resin layers 30, 35, 38, 40, 44, 47, 49 are laminated on the upper surface of mold 55.

At this time, a columnar part 57 is inserted in holes 34 formed respectively in resin layers 30, 35, 38, 40, 44, 47, 49. When resin layers 30, 35, 38, 40, 44, 47, 49 have been laminated, hole portion 42 and hole portion 46 are aligned.

Figure 14:
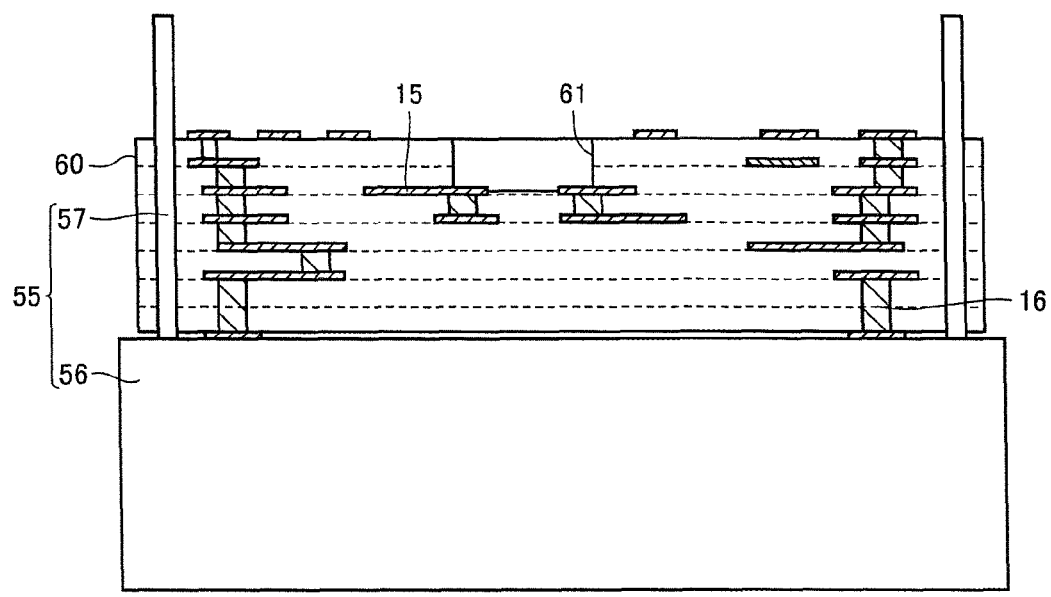
FIG. 14 is a cross-sectional view showing the step after the step shown in FIG. 13.

FIG. 14 is a cross-sectional view showing the step after the step shown in FIG. 13. As shown in FIG. 14, a laminated body which is made up of the laminated resin layers is pressurized, and the laminated body in this state is subjected to a heat treatment. The heating temperature of the heat treatment is lower than the heating temperature in the step of uniting an intermediate substrate 60 and resin layers 51, 53 into a single body, which is performed later. Specifically, the laminated body is heat-treated at a temperature that will not cause each resin layer to flow. This heat treatment can enhance adhesion between the resin layers, and displacement of resin layers from each other is suppressed when chip-type electronic components 12, 13 are inserted.

In this way, intermediate substrate 60 is formed. In the upper surface of intermediate substrate 60, a cavity 61 is formed.

While the cross section shown in FIG. 14 illustrates only cavity 61 in which chip-type electronic component 13 is to be inserted, another cavity in which chip-type electronic component 12 is to be inserted is also formed in intermediate substrate 60. On the bottom surface of cavity 61, a part of internal interconnect 15 is exposed.

Figure 15:
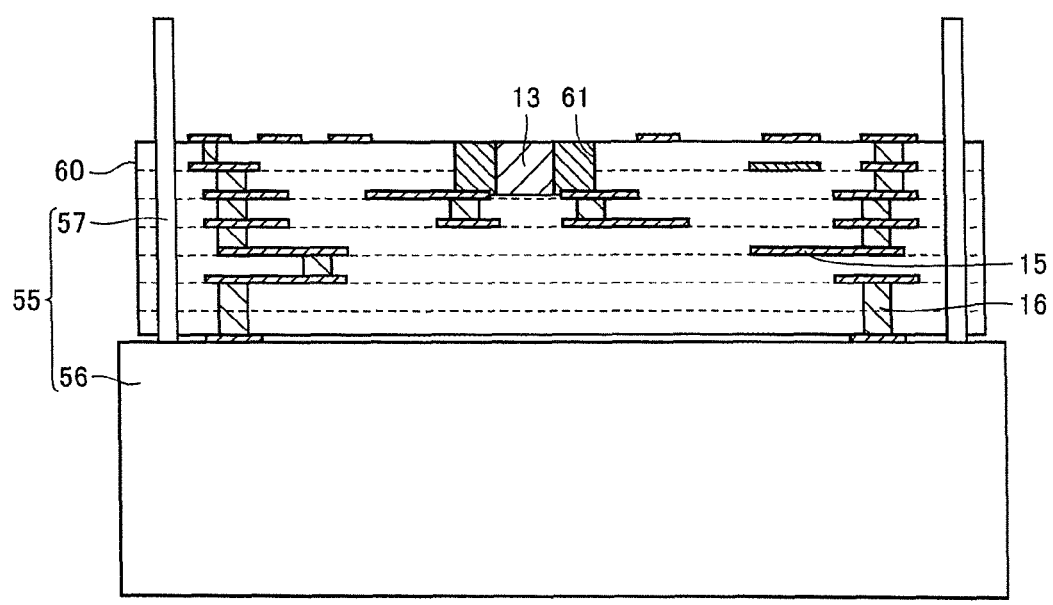
FIG. 15 is a cross-sectional view showing the manufacture step after the step shown in FIG. 14.

FIG. 15 is a cross-sectional view showing the manufacture step after the step shown in FIG. 14. As shown in FIG. 15, chip-type electronic component 13 is inserted in cavity 61. Similarly, chip-type electronic component 12 is inserted in the other cavity.

Figure 16:
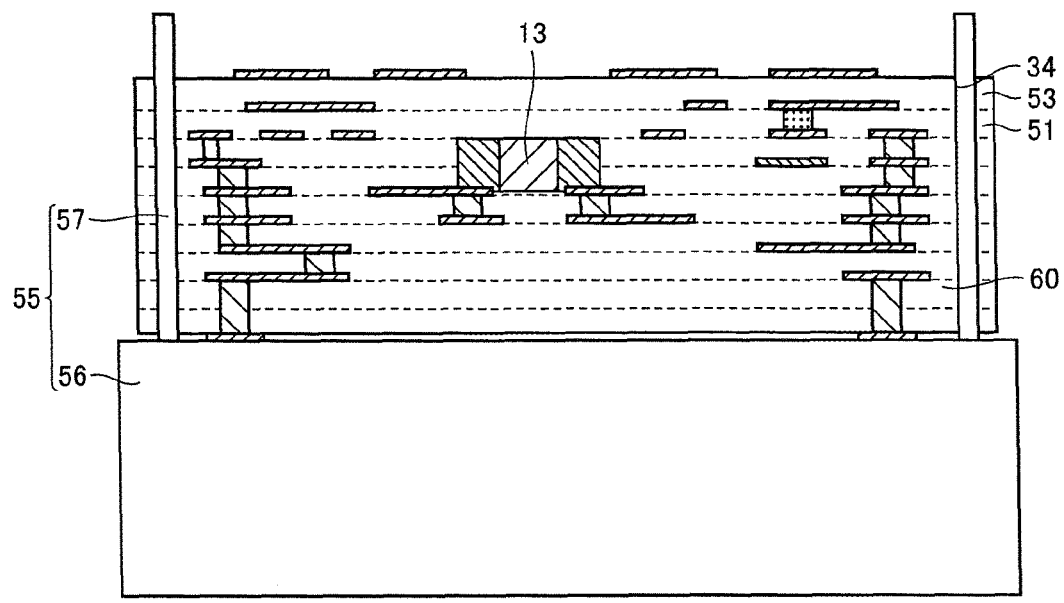
FIG. 16 is a cross-sectional view showing the manufacture step after the step shown in FIG. 15.

FIG. 16 is a cross-sectional view showing the manufacture step after the step shown in FIG. 15. As shown in FIG. 16, on the upper surface of intermediate substrate 60 in which chip-type electronic components 12, 13 have been inserted, resin layers 51, 53 are laminated successively. In holes 34 formed in resin layers 51, 53, columnar part 57 is inserted.

Figure 17:
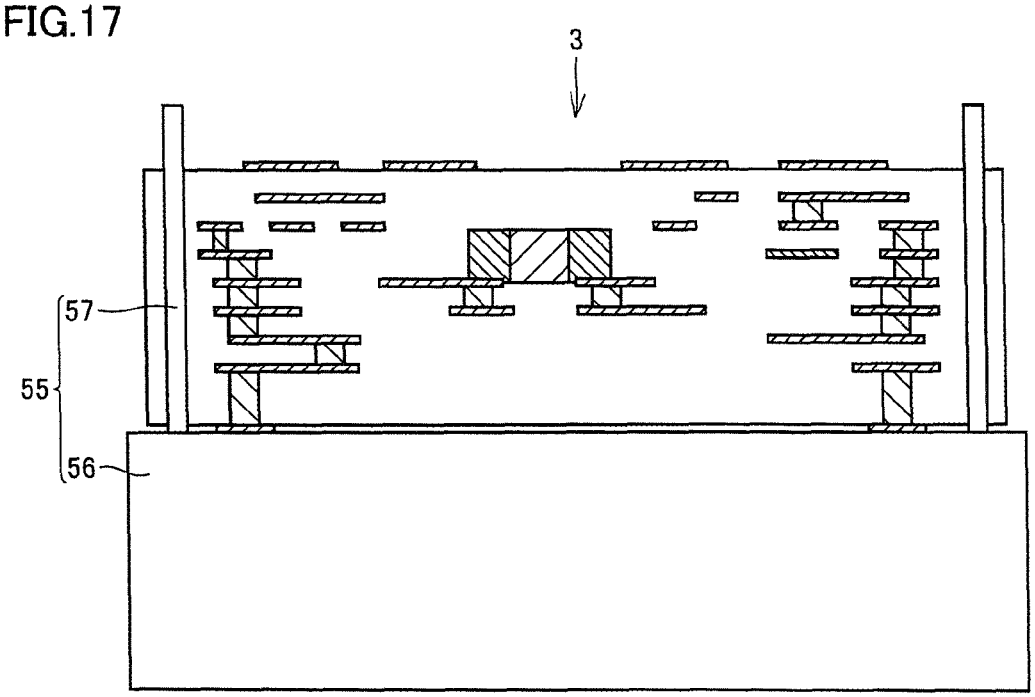
FIG. 17 is a cross-sectional view showing the manufacture step after the step shown in FIG. 16.

FIG. 17 is a cross-sectional view showing the manufacture step after the step shown in FIG. 16. As shown in FIG. 17, with a plurality of resin layers 51, 53 laminated on the upper surface of intermediate substrate 60, intermediate substrate 60 and resin layers 51, 53 are pressurized and also subjected to a heat treatment. With the laminated body pressurized, the heat treatment performed on the laminated body causes each resin layer to soften and flow, so that the resin layers are compression-bonded to each other. The compression bonding causes at least respective surfaces of the resin layers to be united together, and the paste 33 with which each via hole 32 is filled forms via 16.

Accordingly, resin layers 30, 35, 38, 40, 44, 47, 49, 51, 53 are united together into a single body. After this, mounted component 10 and mounted component 11 are implemented on surface conductors 6 of component-embedded substrate 3 by means of solder or the like. Then, the portion where hole 34 is formed is removed to thereby form component-embedded substrate 3. After this, as shown in FIG. 3, component-embedded substrate 3 is implemented on circuit board 2 to thereby form electronic device 1. While the steps for manufacturing a single component-embedded substrate have been described in connection with the present embodiment, a plurality of component-embedded substrates 3 may be obtained by simultaneously forming, in large resin layers that are to form a mother substrate, internal interconnects 15 and the like for a plurality of component-embedded substrates, simultaneously laminating the resin layers, and then cutting the resultant laminated body into pieces for respective component-embedded substrates.

Second Embodiment

A description will be given, using FIGS. 18 to 20, of an electronic device 1a and a component-embedded substrate 3a according to a second embodiment. Of the constituent components shown in FIG. 18, any component identical or corresponding to the component shown in any of FIGS. 1 to 17 is denoted by the same reference character, and the description thereof may not be repeated.

Figure 18:
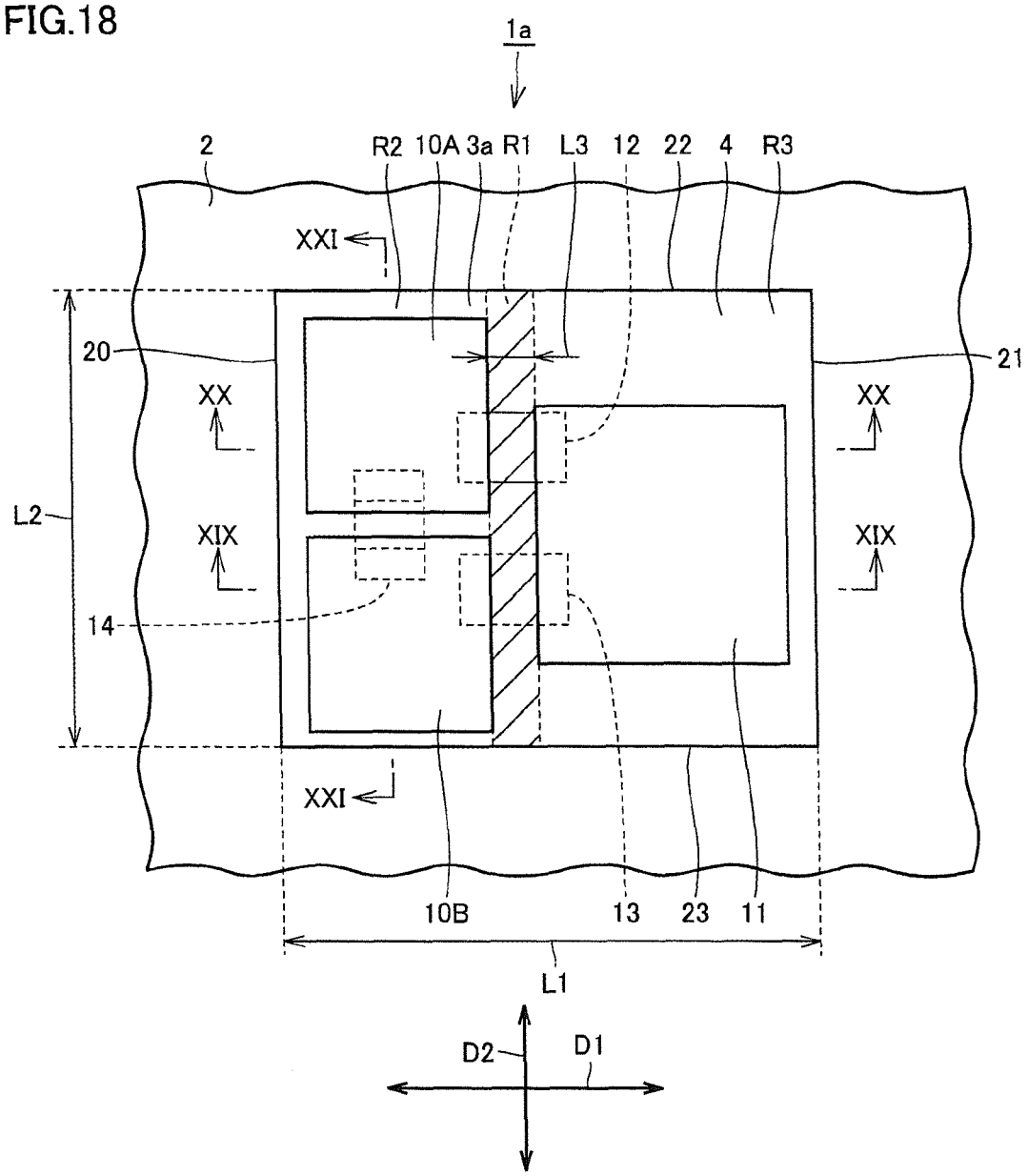
FIG. 18 is a plan view showing an electronic device 1a and a component-embedded substrate 3a according to a second embodiment.

FIG. 18 is a plan view showing electronic device 1a and component-embedded substrate 3a according to the second embodiment. As shown in FIG. 18, component-embedded substrate 3a includes a resin substrate 5 having a mount surface 4, mounted components 10A, 10B, 11 disposed on mount surface 4, and chip-type electronic components 12, 13, 14 disposed in resin substrate 5.

Mounted component 10A and mounted component 11 are spaced from each other along arrangement direction D1, and mounted component 10B and mounted component 11 are spaced from each other along arrangement direction D1. Mounted component 10A and mounted component 10B are spaced from each other along direction D2.

Mount surface 4 includes a region R1, a region R2, and a region R3. Region R1 extends between mounted component 11 and mounted component 10A and between mounted component 11 and mounted component 10B along direction D2. Region R2 is located opposite to mounted component 11 with respect to region R1, and region R3 is located opposite to mounted components 10A, 10B with respect to region R1. Namely, region R2 is a region where mounted components 10A, 10B are arranged, and region R3 is a region where mounted component 11 is arranged.

In a plan view of component-embedded substrate 3a as seen from above mount surface 4, chip-type electronic component 12 is arranged to extend from below mounted component 10A to below mounted component 11, and chip-type electronic component 12 is arranged to also extend from region R2 across region R1 to region R3. Therefore, in resin substrate 5, the portion located between mounted component 10A and mounted component 11 is reinforced by chip-type electronic component 12.

In a plan view of resin substrate 5 as seen from above mount surface 4, chip-type electronic component 13 is arranged to extend from below mounted component 10B to below mounted component 11, and chip-type electronic component 13 is arranged to also extend from region R2 across region R1 to region R3. The portion located between mounted component 10B and mounted component 11 is reinforced by chip-type electronic component 13.

In the plan view of resin substrate 5 as seen from above mount surface 4, chip-type electronic component 14 is arranged to extend from below mounted component 10A to below mounted component 10B. Therefore, in resin substrate 5, the portion located between mounted component 10A and mounted component 10B is reinforced by chip-type electronic component 14.

Figure 19:
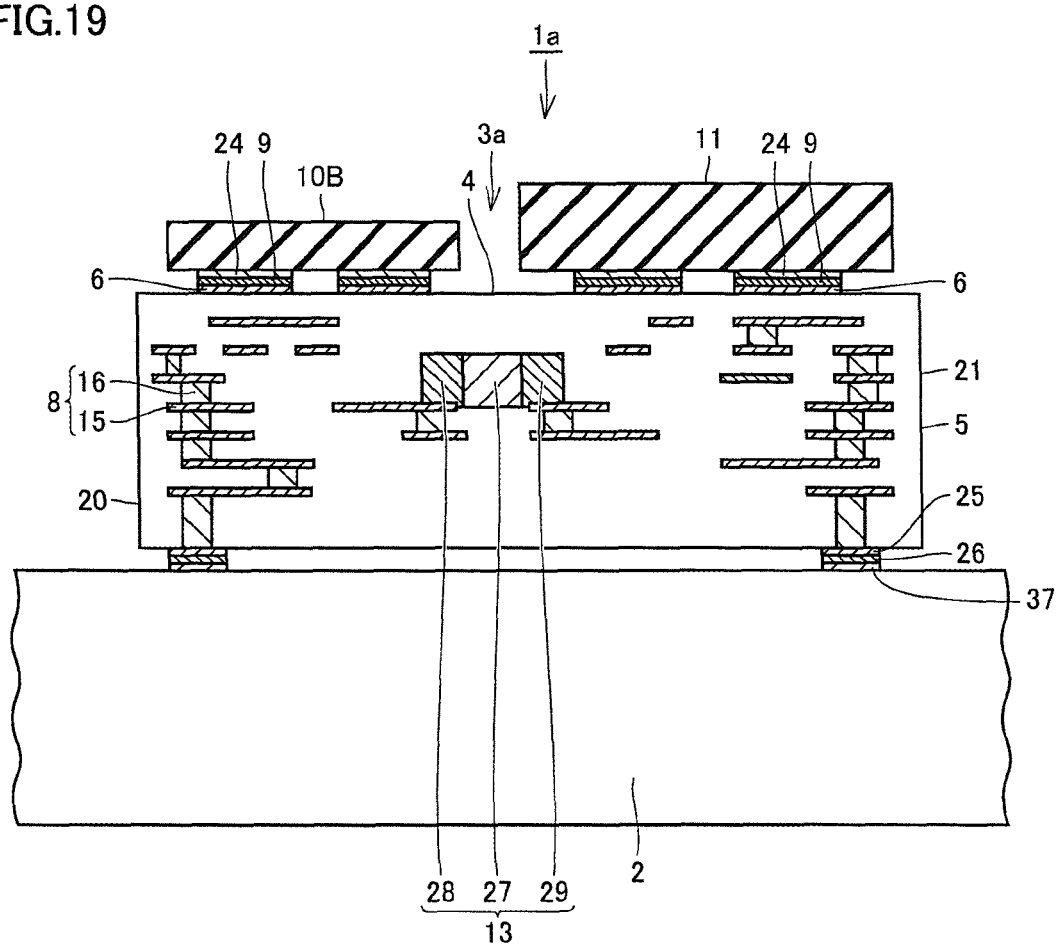
FIG. 19 is a cross-sectional view along a line XIX-XIX shown in FIG. 18.
Figure 20:
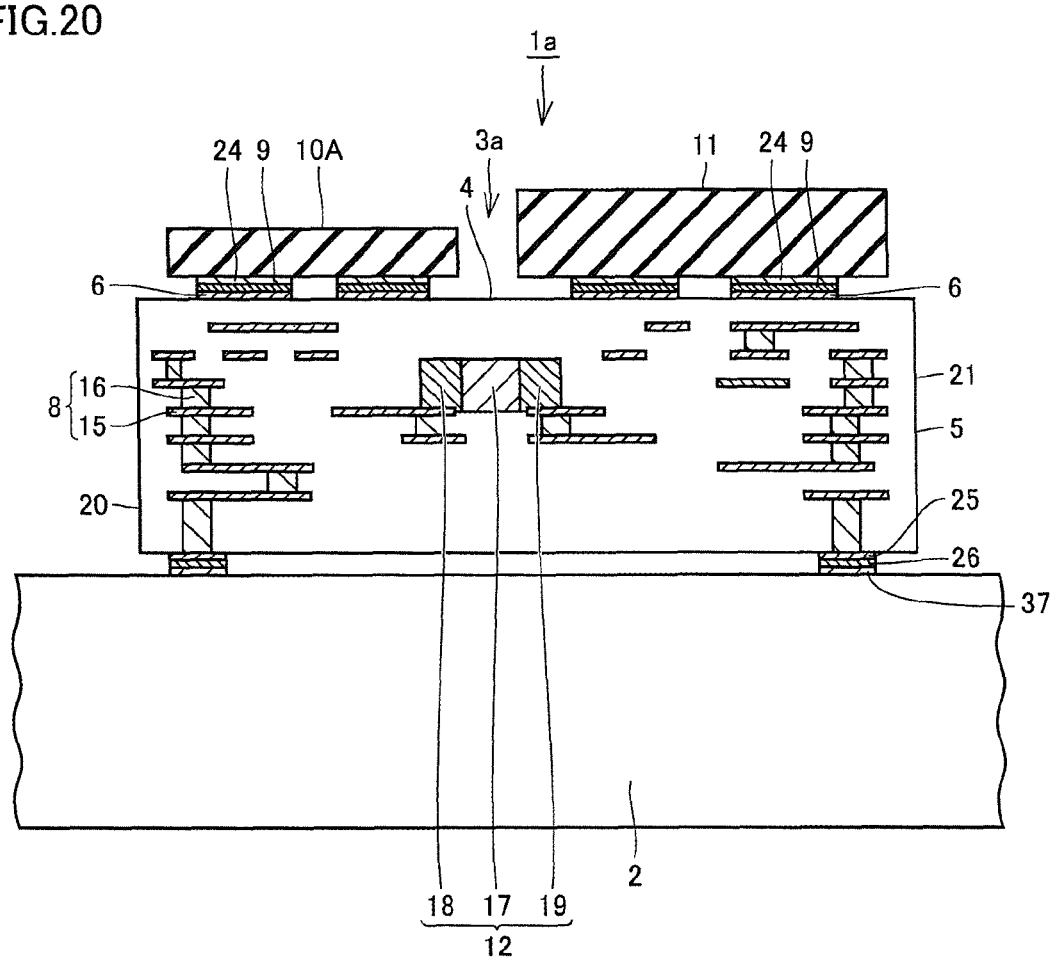
FIG. 20 is a cross-sectional view along a line XX-XX shown in FIG. 18.

FIG. 19 is a cross-sectional view along a line XIX-XIX shown in FIG. 18. As shown in FIG. 19, chip-type electronic component 13 is located relatively closer to mount surface 4 than to the lower surface of resin substrate 5. FIG. 20 is a cross-sectional view along a line XX-XX shown in FIG. 18. As shown in FIG. 20, chip-type electronic component 12 is also located relatively closer to mount surface 4 than to the lower surface of resin substrate 5.

Figure 21:
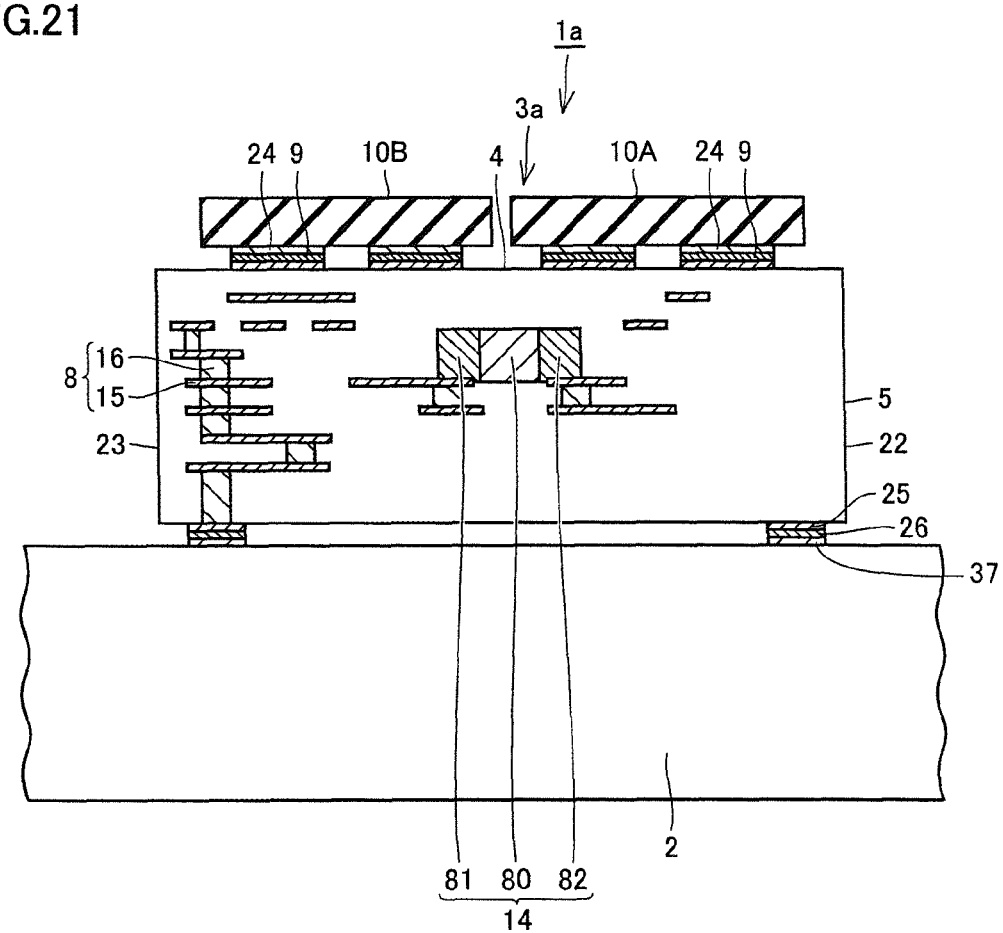
FIG. 21 is a cross-sectional view along a line XXI-XXI shown in FIG. 18.

FIG. 21 is a cross-sectional view along a line XXI-XXI shown in FIG. 18. As shown in FIG. 21, chip-type electronic component 14 includes a dielectric body 80, an electrode 81 disposed on one side surface of dielectric body 80, and an electrode 82 disposed on the other side surface of dielectric body 80. Chip-type electronic component 14 is also located relatively closer to mount surface 4 than to the lower surface of resin substrate 5.

Therefore, in resin substrate 5, the portion located on the mount surface 4 side is reinforced by chip-type electronic components 12, 13, 14.

When an impact force is externally applied to electronic device 1a and component-embedded substrate 3a configured in the above-described manner, a large flexure stress is applied to specific portions of resin substrate 5, namely the portion where region R1 is located and the portion located between mounted component 10A and mounted component 10B.

Meanwhile, in resin substrate 5, the portion where region R1 is located is reinforced by chip-type electronic components 12, 13. Even when an impact force is externally applied, damage (occurrence of cracks) to the portion of resin substrate 5, namely the portion where region R1 is located, can be suppressed.

Further, in resin substrate 5, the portion located between mounted component 10A and mounted component 10B is reinforced by chip-type electronic component 14. Therefore, even when an impact force is applied, damage (occurrence of cracks) to the portion located between mounted component 10A and mounted component 10B is suppressed.

Because mounted component 10A, mounted component 10B, and mounted component 11 are disposed on mount surface 4, an impact force applied to component-embedded substrate 3a causes a flexure stress to be applied to a portion of resin substrate 5 that is located on the mount surface 4 side of resin substrate 5.

Meanwhile, because chip-type electronic components 12, 13, 14 reinforce a portion of resin substrate 5 that is located relatively closer to mount surface 4, damage (occurrence of cracks) to resin substrate 5 is suppressed.

In the present embodiment, chip-type electronic component 14 may not necessarily be provided. In this case as well, occurrence of cracks to the portion where region R1 is located can be suppressed.

Third Embodiment

A description will be given, using FIGS. 22 to 25, of an electronic device 1b and a component-embedded substrate 3b according to a third embodiment. Of the constituent components shown in FIGS. 22 to 25, any component identical or corresponding to the component shown in any of FIGS. 1 to 21 is denoted by the same reference character, and the description thereof may not be repeated.

Figure 22:
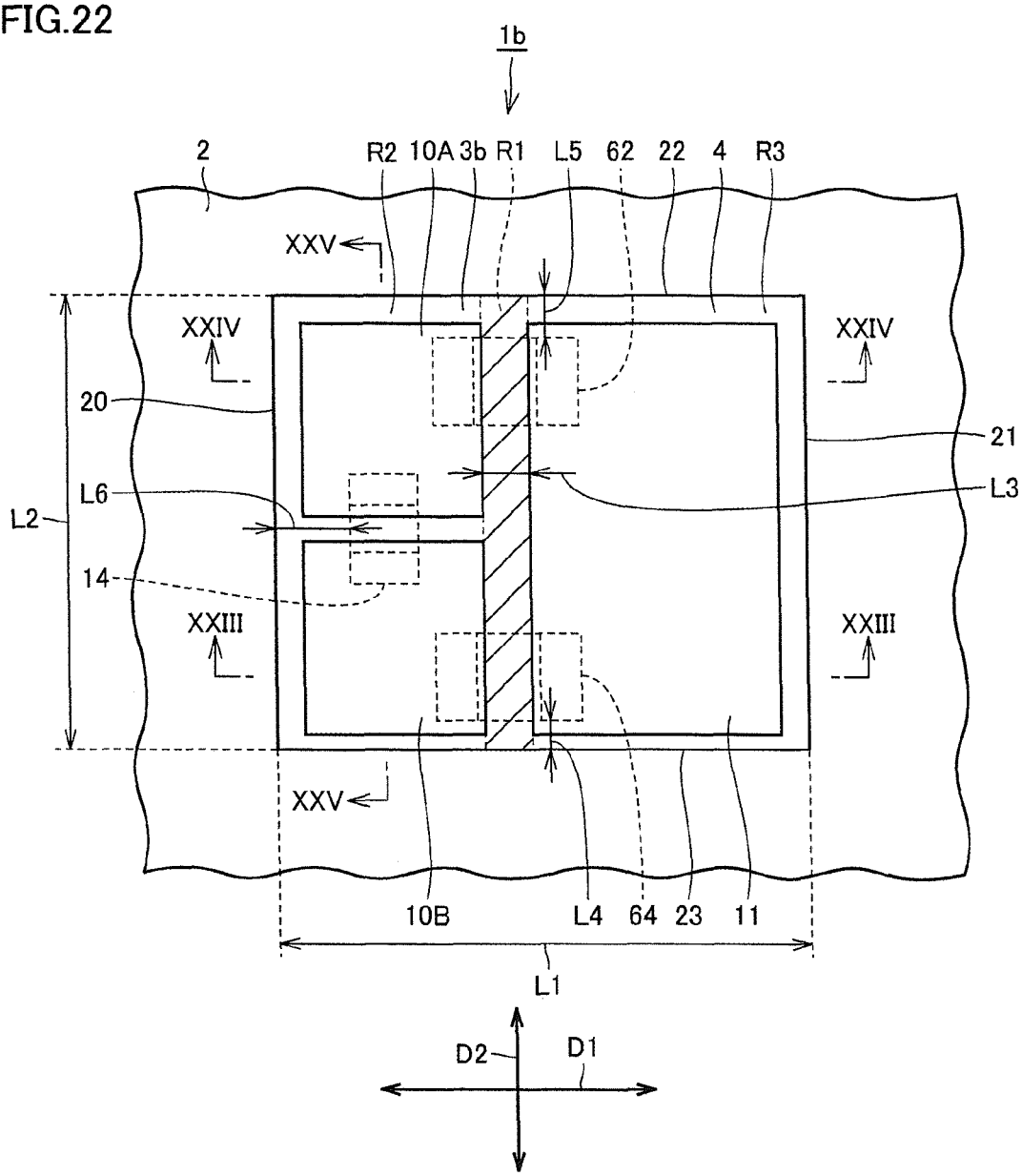
FIG. 22 is a plan view showing an electronic device 1b according to a third embodiment.

FIG. 22 is a plan view showing electronic device 1b according to the third embodiment. As shown in FIG. 22, electronic device 1b includes a resin substrate 5 having a mount surface 4, mounted components 11, 10A, 10B disposed on mount surface 4, and chip-type electronic components 14, 62, 64 disposed in resin substrate 5.

Mounted component 11 and mounted component 10A are spaced from each other along arrangement direction D1, and mounted component 10B and mounted component 11 are spaced from each other along arrangement direction D1.

Mounted component 10A is located relatively closer to side surface 22 as compared with mounted component 10B, and mounted component 10B is located relatively closer to side surface 23 as compared with mounted component 10A.

Mount surface 4 includes a region R1, a region R2, and a region R3. Region R1 extends between mounted component 11 and mounted component 10A and between mounted component 11 and mounted component 10B along direction D2. Region R2 is located opposite to mounted component 11 with respect to region R1, and region R3 is located opposite to mounted components 10A, 10B with respect to region R1. Namely, region R2 is a region where mounted components 10A, 10B are arranged, and region R3 is a region where mounted component 11 is arranged.

In a plan view of resin substrate 5 as seen from above mount surface 4, chip-type electronic component 64 is arranged to extend from below mounted component 10B across region R1 to below mounted component 11. Chip-type electronic component 62 is arranged to extend from below mounted component 10A across region R1 to below mounted component 11. Chip-type electronic component 14 is arranged to extend from below mounted component 10A to below mounted component 10B.

The distance between chip-type electronic component 64 and side surface 23 is herein indicated by distance L4, and the distance between chip-type electronic component 62 and side surface 22 is herein indicated by distance L5. The distance between chip-type electronic component 14 and side surface 20 is herein indicated by distance L6.

Distance L4 and distance L5 are shorter than distance L6. Chip-type electronic component 62 and chip-type electronic component 64 are thus located relatively closer to the peripheral surface of resin substrate 5 as compared with chip-type electronic component 14.

Chip-type electronic component 14 has a lateral dimension of 0.6 mm, a longitudinal dimension of 0.3 mm, and a height dimension of 0.15 mm. The size of chip-type electronic components 62, 64 is 1.0 mm×0.5 mm×0.15 mm. Thus, the size of chip-type electronic components 62, 64 is larger than the size of chip-type electronic component 14.

When an impact force is applied to electronic device 1b and component-embedded substrate 3b, a large flexure stress is exerted for example on the ends of region R1.

Meanwhile, because chip-type electronic components 62, 64 are arranged on the end sides of region R1, the portions where the ends of region R1 are located in resin substrate 5 are reinforced by chip-type electronic components 62, 64.

In particular, chip-type electronic components 62, 64 are larger in size than chip-type electronic component 13, and the ends of region R1 are strongly reinforced by chip-type electronic components 62, 64. Therefore, even when an impact force is applied to electronic device 1b and component-embedded substrate 3b, damage to resin substrate 5 is suppressed.

Figure 23:
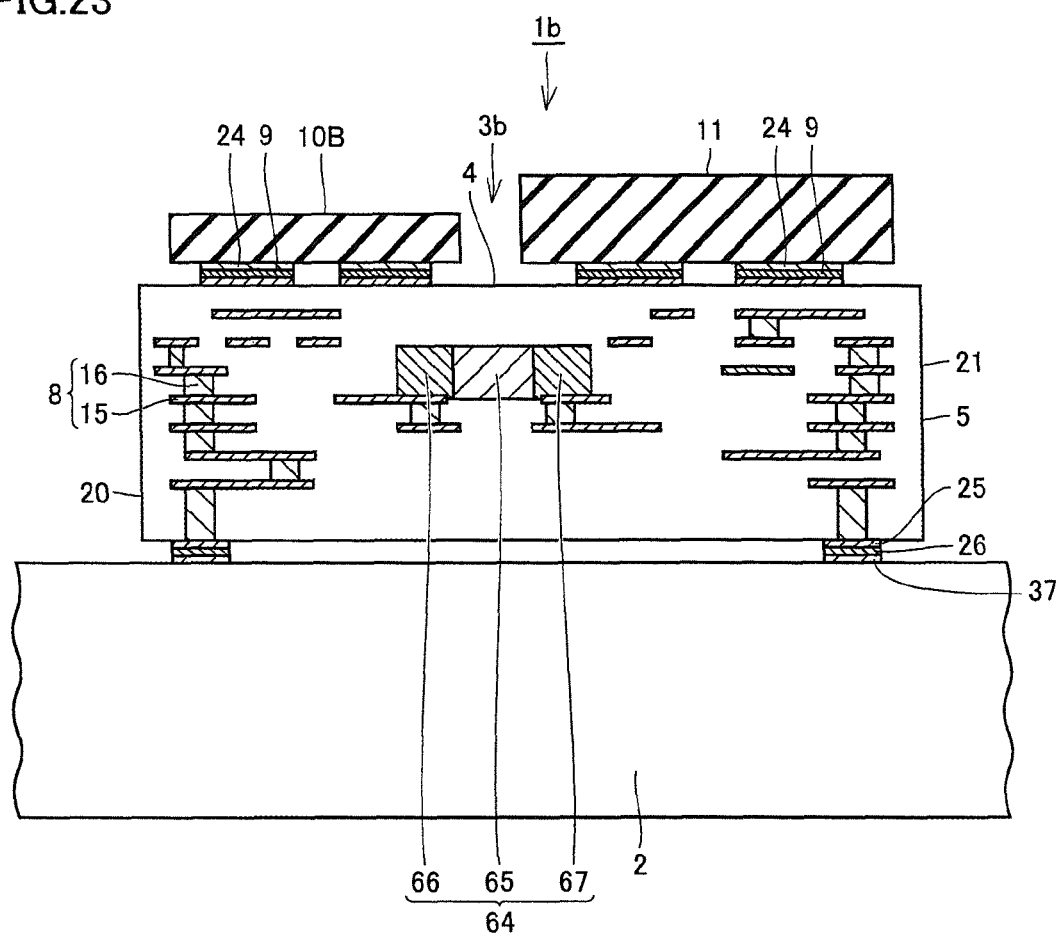
FIG. 23 is a cross-sectional view along a line XXIII-XXIII shown in FIG. 22.

FIG. 23 is a cross-sectional view along a line XXIII-XXIII shown in FIG. 22. As shown in FIG. 23, chip-type electronic component 64 includes a dielectric body 65, an electrode 66 disposed on one side surface of dielectric body 65, and an electrode 67 disposed on the other side surface of dielectric body 65. Chip-type electronic component 64 is located relatively closer to mount surface 4 than to the lower surface of resin substrate 5.

Figure 24:
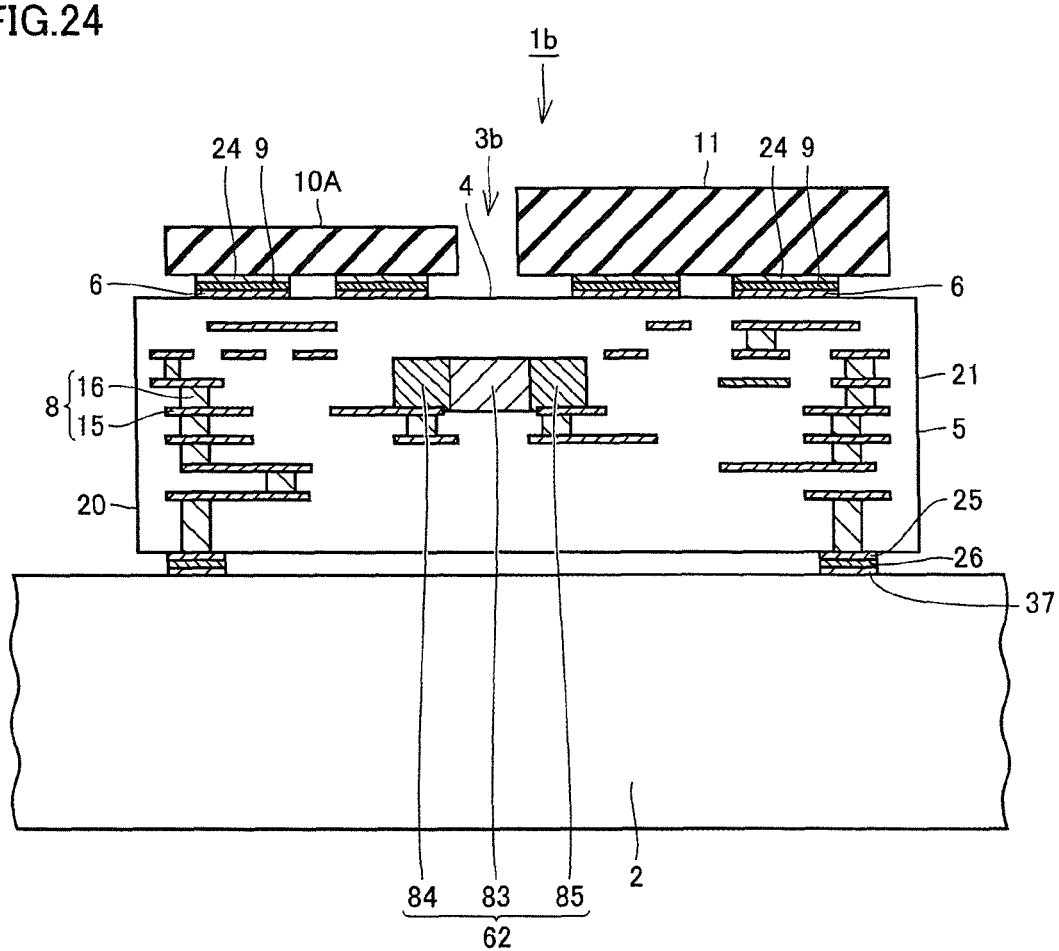
FIG. 24 is a cross-sectional view along a line XXIV-XXIV shown in FIG. 22.

FIG. 24 is a cross-sectional view along a line XXIV-XXIV shown in FIG. 22. As shown in FIG. 24, chip-type electronic component 62 includes a dielectric body 83, an electrode 84 disposed on one side surface of dielectric body 83, and an electrode 85 disposed on the other side surface of dielectric body 83. Chip-type electronic component 64 is located relatively closer to mount surface 4 than to the lower surface of resin substrate 5.

Figure 25:
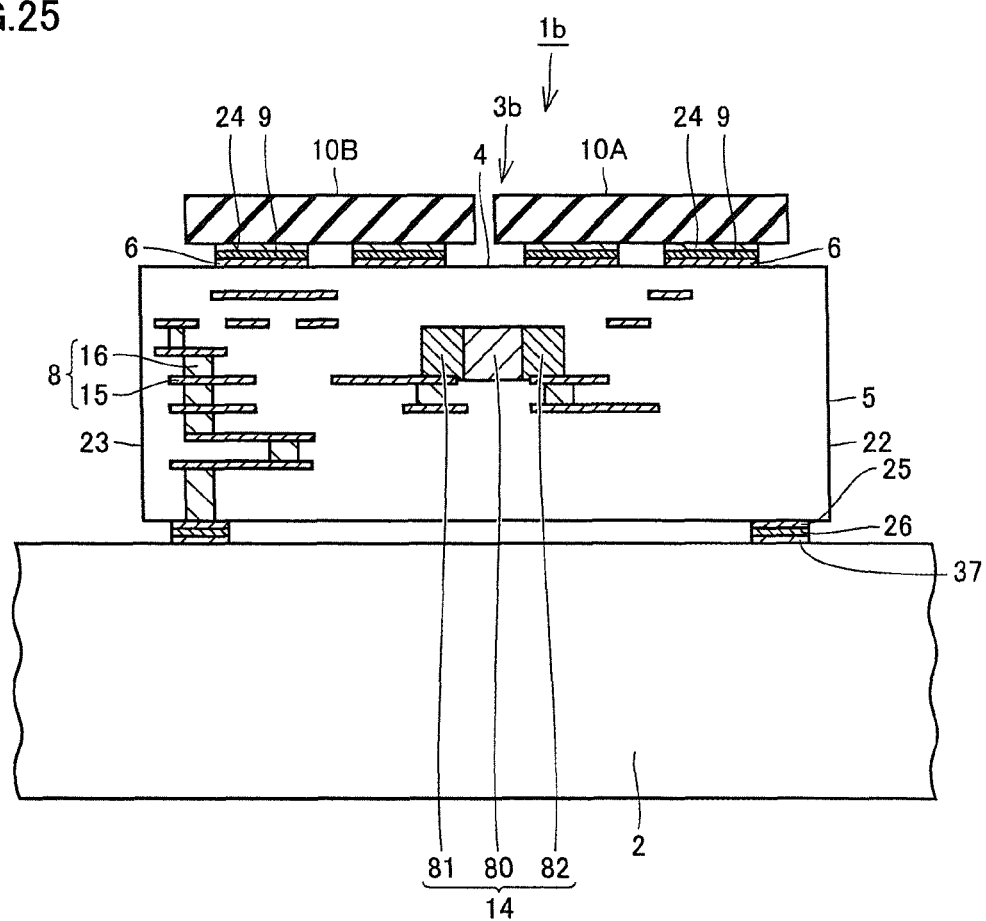
FIG. 25 is a cross-sectional view along a line XXV-XXV shown in FIG. 22.

FIG. 25 is a cross-sectional view along a line XXV-XXV shown in FIG. 22. As shown in FIG. 25, chip-type electronic component 14 is located relatively closer to mount surface 4 than to the lower surface of resin substrate 5.

As set forth above, chip-type electronic components 14, 62, 64 are each located relatively closer to mount surface 4 than to the lower surface of resin substrate 5. Therefore, a portion of resin substrate 5 that is located on the mount surface 4 side is reinforced by chip-type electronic components 14, 62, 64. Accordingly, even when an impact force is applied to component-embedded substrate 3b, damage to resin substrate 5 can be suppressed.

In the present embodiment, chip-type electronic component 14 may not necessarily be provided. In this case as well, occurrence of cracks to the portion where region R1 is located can be suppressed.

Fourth Embodiment

A description will be given, using FIGS. 26 to 29, of an electronic device 1c and a component-embedded substrate 3c according to a fourth embodiment. Of the constituent components shown in FIGS. 26 to 29, any component identical or corresponding to the component shown in any of FIGS. 1 to 25 is denoted by the same reference character, and the description thereof may not be repeated.

Figure 26:
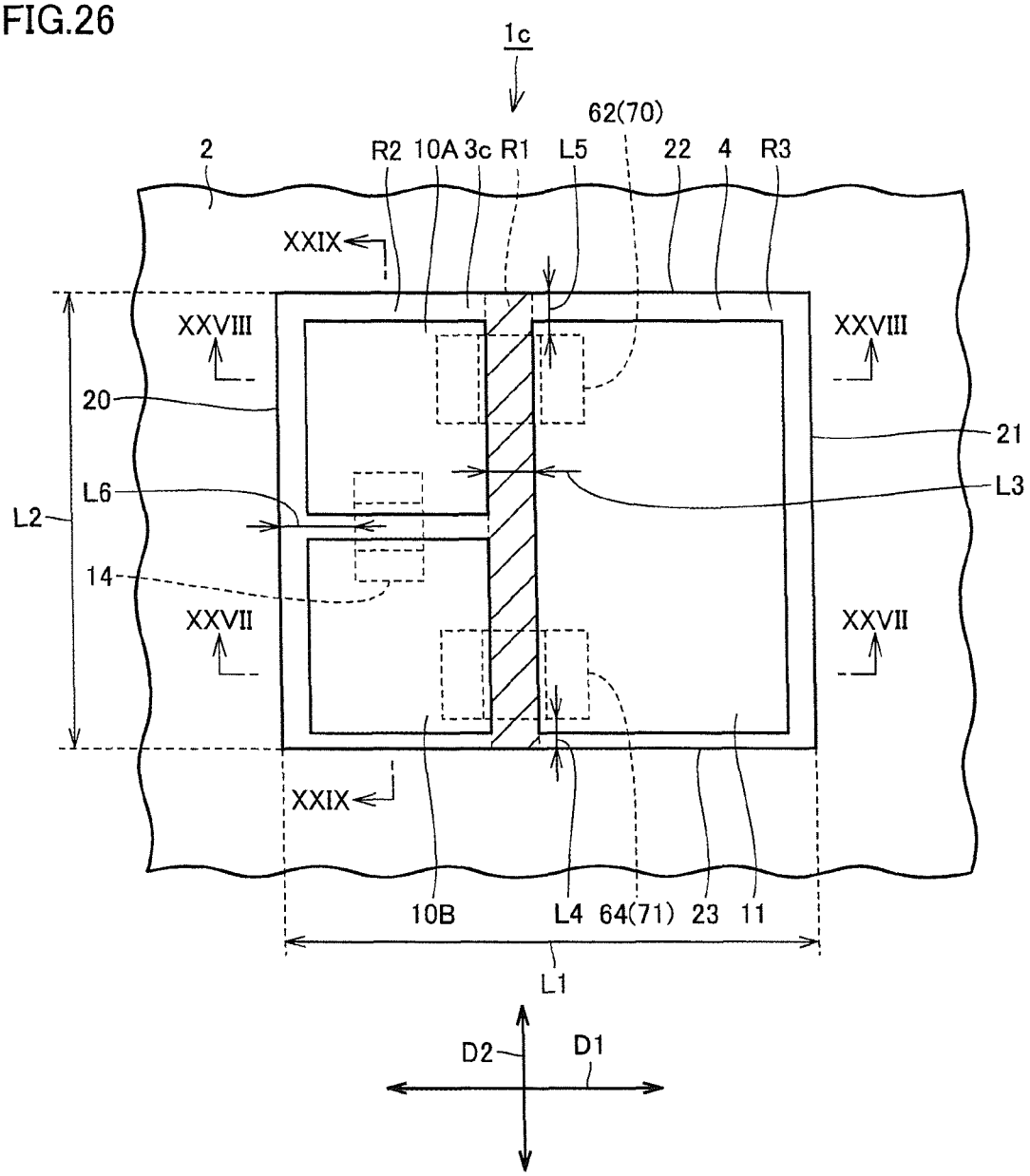
FIG. 26 is a plan view showing an electronic device 1c according to a fourth embodiment.

FIG. 26 is a plan view showing electronic device 1c according to the fourth embodiment. As shown in FIG. 26, component-embedded substrate 3c includes a resin substrate 5 having a mount surface 4, and chip-type electronic components 14, 62, 64, 70, 71 disposed in resin substrate 5.

In a plan view of component-embedded substrate 3c as seen from above mount surface 4, chip-type electronic components 62, 70 are arranged to extend from below mounted component 10A across region R1 to below mounted component 11. Chip-type electronic components 64, 71 are arranged to extend from below mounted component 10B across region R1 to below mounted component 11.

Further, chip-type electronic component 14 is arranged from below mounted component 10A to below mounted component 10B.

Figure 27:
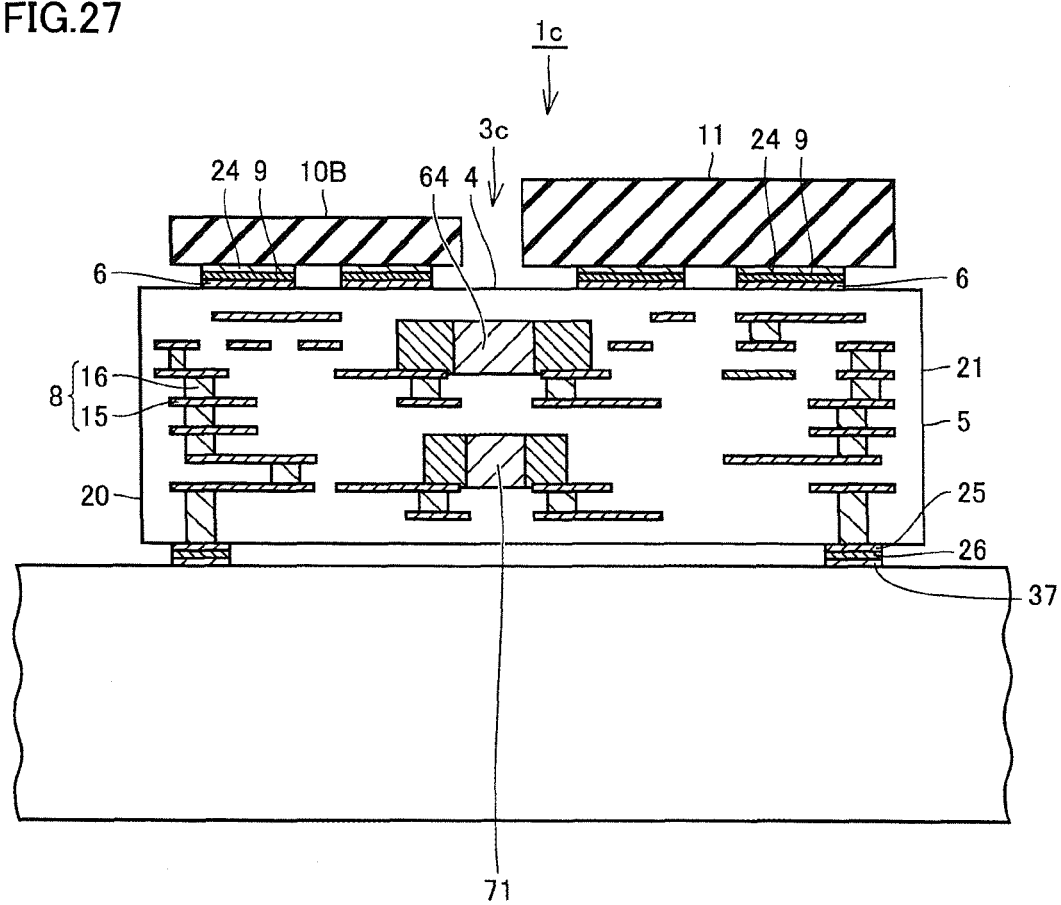
FIG. 27 is a cross-sectional view along a line XXVII-XXVII shown in FIG. 26.

FIG. 27 is a cross-sectional view along a line XXVII-XXVII shown in FIG. 26. As shown in FIG. 27, chip-type electronic component 71 and chip-type electronic component 64 are arranged in such a manner that they are aligned in the thickness direction of resin substrate 5. Chip-type electronic component 64 is located relatively closer to mount surface 4 as compared with chip-type electronic component 71. The size of chip-type electronic component 64 is larger than that of chip-type electronic component 71.

Figure 28:
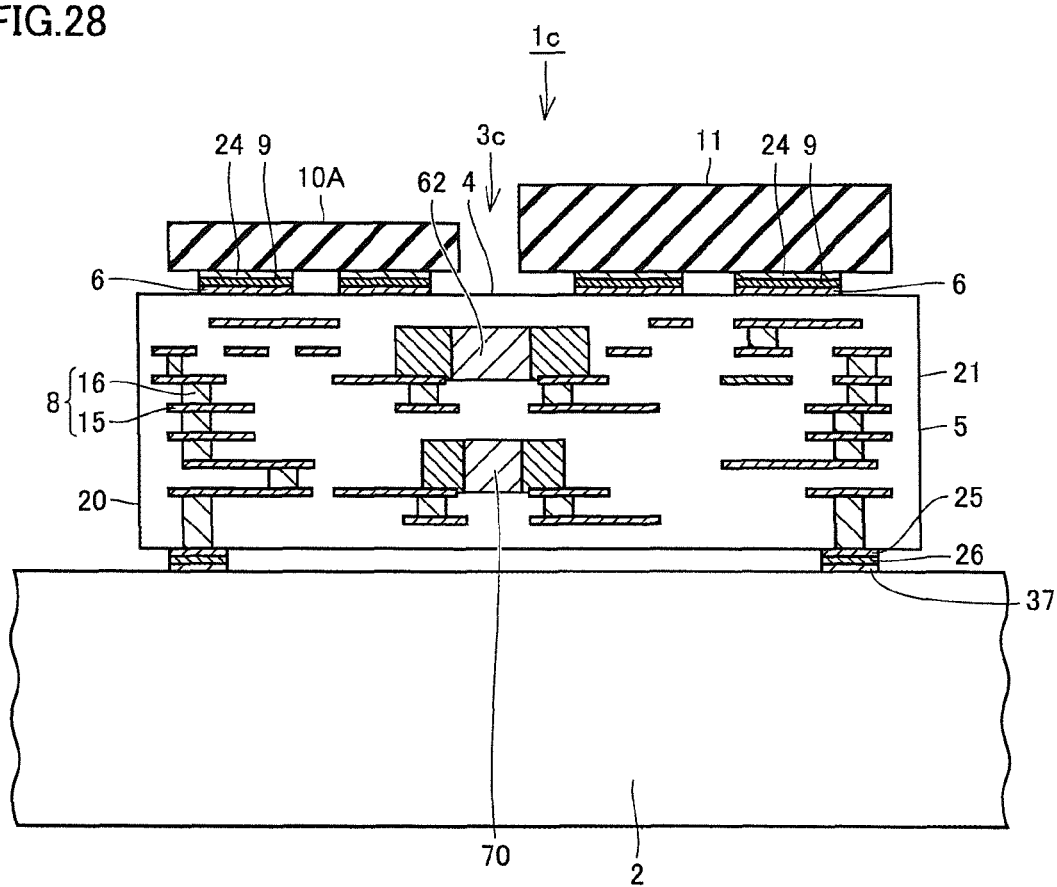
FIG. 28 is a cross-sectional view along a line XXVIII-XXVIII shown in FIG. 26.

FIG. 28 is a cross-sectional view along a line XXVIII-XXVIII shown in FIG. 26. As shown in FIG. 28, chip-type electronic component 70 and chip-type electronic component 62 are arranged in such a manner that they are aligned in the thickness direction of resin substrate 5. Chip-type electronic component 62 is located relatively closer to mount surface 4 as compared with chip-type electronic component 70. The size of chip-type electronic component 62 is larger than that of chip-type electronic component 70.

For example, the size of chip-type electronic components 62, 64 is 1.0 mm×0.5 mm×0.15 mm. The size of chip-type electronic components 70, 71 is 0.6 mm, 0.3 mm, 0.15 mm.

Figure 29:
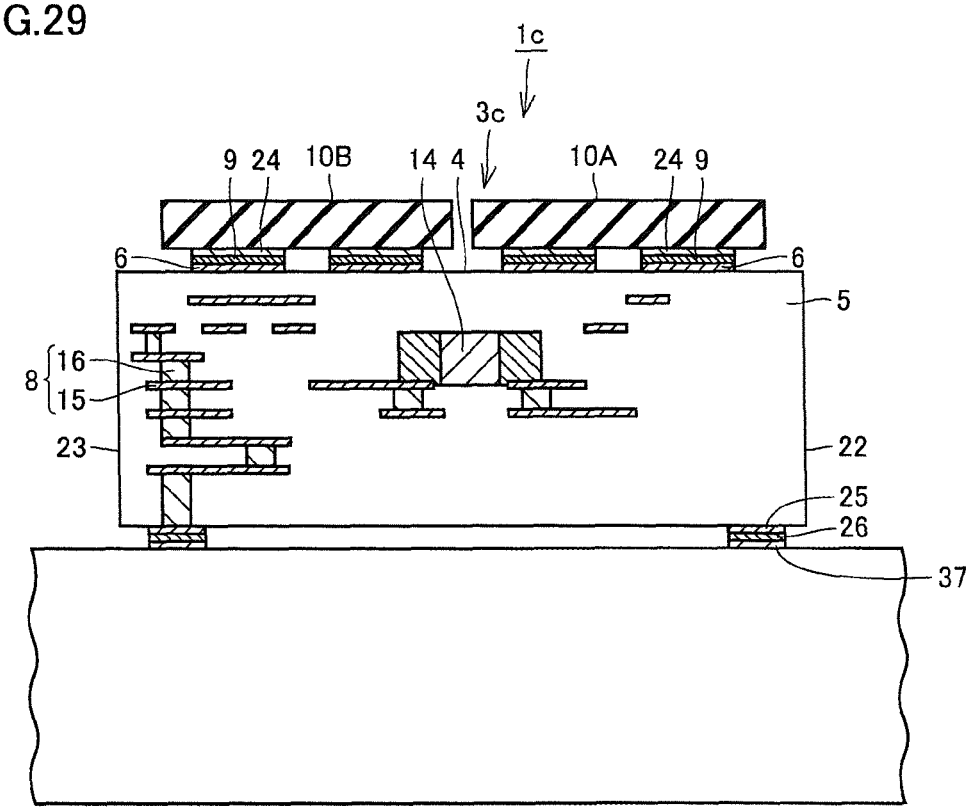
FIG. 29 is a cross-sectional view along a line XXIX-XXIX shown in FIG. 26.

FIG. 29 is a cross-sectional view along a line XXIX-XXIX shown in FIG. 26. As shown in FIG. 29, chip-type electronic component 14 is located relatively closer to mount surface 4 than to the lower surface of resin substrate 5.

In FIG. 26, the distance between chip-type electronic components 62, 64, 70, 71 and the peripheral surface of resin substrate 5 is shorter than the distance between chip-type electronic component 13 and the peripheral surface of resin substrate 5.

Thus, a plurality of chip-type electronic components is located relatively closer to the peripheral surface of resin substrate 5, to thereby reinforce the peripheral surface of resin substrate 5. In particular, a plurality of chip-type electronic components are arranged in the portions located at the ends of region R1, to thereby reinforce the end sides of region R1 in resin substrate 5.

Further, large chip-type electronic components 62, 64 are each arranged at the location relatively closer to mount surface 4, to thereby strongly reinforce mount surface 4 of resin substrate 5. Accordingly, when an impact force is externally applied to component-embedded substrate 3c, damage to resin substrate 5 can be suppressed.

Example 1

Using Table 1 below, a description will be given of a drop test for electronic devices of comparative examples and electronic devices 1 shown in FIG. 1.

In this drop test, 36 electronic devices according to each of Comparative Example 1 and Comparative Example 2, and 36 electronic devices 1 shown in FIG. 1 are prepared. Then, from a height of 1.2 m, each electronic device is freely dropped ten times to a concrete floor with the mount surface directed downward. The electronic device of Comparative Example 1 is an electronic device having two mounted components disposed on the mount surface, like electronic device 1 in FIG. 1, without the chip-type electronic components disposed in the resin substrate. The electronic device of Comparative Example 2 is like an electronic device 1e shown in FIG. 31. Namely, in a plan view of a component-embedded substrate 3e, one chip-type electronic component 86 is disposed at or around the central portion of the resin substrate, between mounted component 10 and mounted component 11.

TABLE 1

Figure 31:
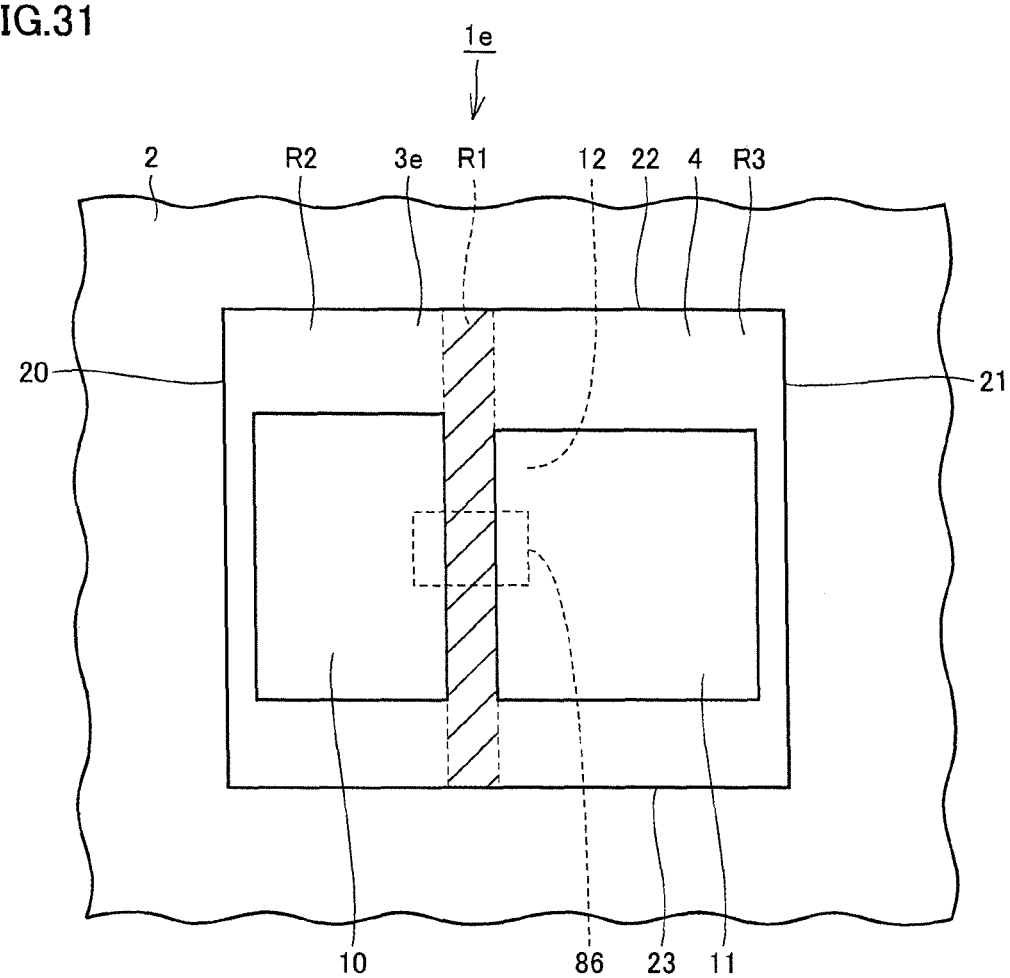
FIG. 31 is a plan view of an electronic device according to a comparative example.

| condition | number of defective samples/ total number of samples |
| --- | --- |
| electronic device without chip-type electronic components (Comparative Example 1) | 3/36 |
| electronic device shown in FIG. 31 | 2/36 |
| electronic device 1 shown in FIG. 1 | 0/36 |

As shown in Table 1, regarding Comparative Example 1, cracks occurred to three electronic devices out of the 36 electronic devices and, regarding Comparative Example 2, cracks occurred to two electronic devices out of the 36 electronic devices. In contrast, no crack occurred to electronic devices 1 shown in FIG. 1.

As seen from the foregoing, electronic device 1 of the present invention enables suppression of occurrence of cracks to resin substrate 5 in component-embedded substrate 3, even when an impact force is applied to electronic device 1.

Example 2

Figure 30:
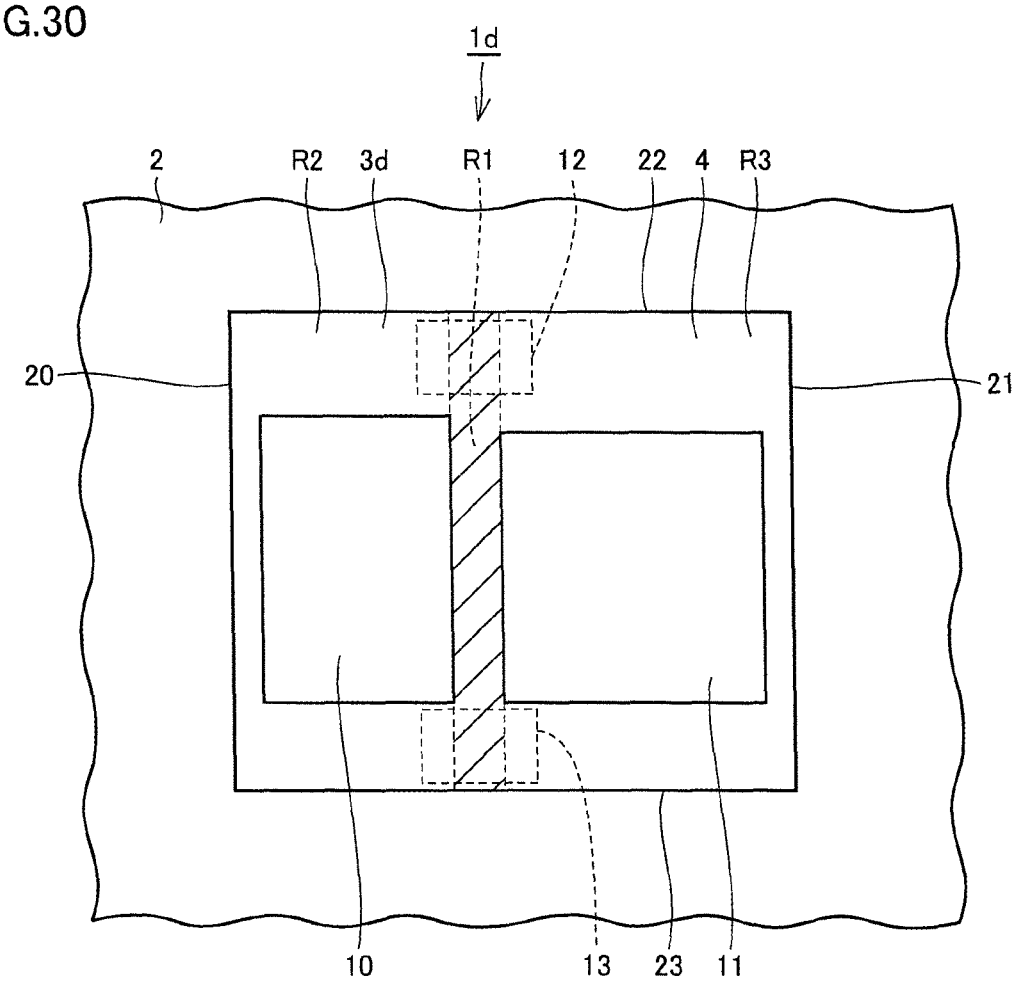
FIG. 30 is a plan view showing an electronic device 1d according to Example 2.

Example 2 will be described using FIG. 30. In an electronic device 1d shown in FIG. 30, a chip-type electronic component 13 and a chip-type electronic component 12 are each arranged to extend from region R2 across region R1 to region R3. In the example shown in FIG. 30, in a plan view of a component-embedded substrate 3d, chip-type electronic component 12 is not located below mounted components 10, 11. Chip-type electronic component 12 is rather located relatively closer to side surface 22, as compared with mounted components 10, 11. Chip-type electronic component 13 is located relatively closer to side surface 23, as compared with mounted components 10, 11. Regarding electronic device 1d shown in FIG. 30, no chip-type electronic component is disposed in component-embedded substrate 3d except for chip-type electronic components 12, 13. In this electronic device 1d, while chip-type electronic components 12, 13 are not located below mounted components 10, 11, a plurality of chip-type electronic components 12, 13 arranged in region R1 and region R3 can still suppress occurrence of cracks which are likely to occur to region R1. In particular, regarding electronic device 1d, chip-type electronic components 12, 13 are arranged in regions R1-R3 and in the vicinity of side surfaces 22, 23 where cracks are more likely to occur. Thus, occurrence of cracks to resin substrate 5 can further be suppressed.

The foregoing is the description of the embodiments of the present invention. It should be construed that the embodiments disclosed herein are by way of illustration in all respects, not by way of limitation. It is intended that the scope of the present invention is defined by claims, and encompasses all modifications equivalent in meaning and scope to the claims. Further, the above-described numerical values and the like are given by way of example, and the present invention is not limited to the above-described numerical values and ranges.

In the case where the component-embedded substrate has three or more mounted components on the mount surface, it is preferable that two mounted components of a relatively larger size out of the three or more mounted components are identified as a first mounted component and a second mounted component of the present invention, and a first chip-type electronic component and a second chip-type electronic component of the present invention are accordingly arranged, since this enables the highest effect of suppressing occurrence of cracks.

In the case where four or more mounted components are disposed on the mount surface and three or more electronic components are disposed in the resin substrate, it is preferable that three mounted components of a relatively larger size out of the four or more mounted components are identified as a first mounted component, a second mounted component, and a third mounted component of the present invention, and a first chip-type electronic component, a second chip-type electronic component, and a third chip-type electronic component of the present invention are accordingly arranged, since this enables the highest effect of suppressing occurrence of cracks.

INDUSTRIAL APPLICABILITY

The present invention is applicable to a component-embedded substrate.

REFERENCE SIGNS LIST 1, 1a-1e: electronic device; 2: circuit board; 3, 3a-3e: component-embedded substrate; 4: mount surface; 5: resin substrate; 6: surface conductor; 8: internal conductor; 9: joint; 10, 10A, 10B, 11: mounted component; 12, 13, 14, 62, 64, 70, 71: chip-type electronic component; 15: internal interconnect; 16: via; 17, 27, 65, 80, 83: dielectric body; 18, 19, 25, 28, 29, 66, 67, 81, 82, 84, 85: electrode; 20, 21, 22, 23: side surface; 30, 35, 38, 40, 44, 47, 49, 51, 53: resin layer; 31, 36, 39, 41, 45, 48, 50, 52, 54: resin sheet; 32: via hole; 33: paste; 34: hole; 42, 46: hole portion; 55: mold; 56: platform; 57: columnar part; 60: intermediate substrate

The invention claimed is:

1. A component-embedded substrate comprising:
a resin substrate having a mount surface and a peripheral surface surrounding a perimeter of said mount surface;
a first mounted component mounted on said mount surface and connected to surface conductors;
a second mounted component mounted on said mount surface and connected to surface conductors and spaced from said first mounted component;
a first electronic component disposed in said resin substrate; and
a second electronic component disposed in said resin substrate and spaced from said first electronic component,
said mount surface including, as viewed in a direction perpendicular to said mount surface:
a first region located between said first mounted component and said second mounted component and extending in a cross direction, the cross direction being perpendicular to an arrangement direction in which said first mounted component and said second mounted component are arranged with respect to each other;
a second region located opposite to said second mounted component with respect to said first region; and
a third region located opposite to said first mounted component with respect to said first region,
said first electronic component and said second electronic component being spaced from each other along said cross direction,
said first electronic component and said second electronic component being arranged to extend from said second region across said first region to said third region as viewed in a direction perpendicular to said mount surface,
wherein both the first electronic component and the second electronic component are arranged to extend below the first mounted component across the first region to below the second mounted component.

2. The component-embedded substrate according to claim 1, further comprising:
a third mounted component mounted on said mount surface and spaced from said first mounted component and said second mounted component; and
a third electronic component disposed in said resin substrate, wherein
said third electronic component is arranged to extend from below said first mounted component to below said third mounted component, or from below said second mounted component to below said third mounted component as viewed in a direction perpendicular to said mount surface.

3. The component-embedded substrate according to claim 2, wherein
said first electronic component is located relatively closer to the peripheral surface of said resin substrate as compared with said third electronic component, and
said first electronic component is larger in size than said third electronic component as viewed in a direction perpendicular to said mount surface.

4. The component-embedded substrate according to claim 3, wherein
said resin substrate has a lower surface located opposite to said mount surface, and
said first electronic component is located relatively closer to said mount surface than to said lower surface.

5. The component-embedded substrate according to claim 3, further comprising an additional electronic component disposed in said resin substrate, wherein
said resin substrate has a lower surface located opposite to said mount surface,
said additional electronic component is located relatively closer to said lower surface as compared with said first electronic component, and
said first electronic component is larger in size than said additional electronic component as viewed in a direction perpendicular to said mount surface.

6. The component-embedded substrate according to claim 3, further comprising an additional electronic component disposed in said resin substrate, wherein
the additional electronic component extends below the first mounted component across the first region to below the second mounted component and is aligned with the first electronic component in a thickness direction of the resin substrate.

7. The component-embedded substrate according to claim 2, wherein
said resin substrate has a lower surface located opposite to said mount surface, and
said first electronic component is located relatively closer to said mount surface than to said lower surface.

8. The component-embedded substrate according to claim 2, further comprising a fourth electronic component disposed in said resin substrate, wherein
said resin substrate has a lower surface located opposite to said mount surface,
said fourth electronic component is located relatively closer to said lower surface as compared with said first electronic component, and
said first electronic component is larger in size than said fourth electronic component as viewed in a direction perpendicular to said mount surface.

9. The component-embedded substrate according to claim 2, further comprising an additional electronic component disposed in said resin substrate, wherein
the additional electronic component extends below the first mounted component across the first region to below the second mounted component and is aligned with the first electronic component in a thickness direction of the resin substrate.

10. The component-embedded substrate according to claim 1, wherein
said resin substrate has a lower surface located opposite to said mount surface, and
said first electronic component is located relatively closer to said mount surface than to said lower surface.

11. The component-embedded substrate according to claim 10, further comprising an additional electronic component disposed in said resin substrate, wherein
said resin substrate has a lower surface located opposite to said mount surface,
said additional electronic component is located relatively closer to said lower surface as compared with said first electronic component, and
said first electronic component is larger in size than said additional electronic component as viewed in a direction perpendicular to said mount surface.

12. The component-embedded substrate according to claim 10, further comprising an additional electronic component disposed in said resin substrate, wherein
the additional electronic component extends below the first mounted component across the first region to below the second mounted component and is aligned with the first electronic component in a thickness direction of the resin substrate.

13. The component-embedded substrate according to claim 1, further comprising an additional electronic component disposed in said resin substrate, wherein
said resin substrate has a lower surface located opposite to said mount surface,
said additional electronic component is located relatively closer to said lower surface as compared with said first electronic component, and
said first electronic component is larger in size than said additional electronic component as viewed in a direction perpendicular to said mount surface.

14. The component-embedded substrate according to claim 1, further comprising an additional electronic component disposed in said resin substrate, wherein
the additional electronic component extends below the first mounted component across the first region to below the second mounted component and is aligned with the first electronic component in a thickness direction of the resin substrate.

* * * * *